US012684999B2

(12) United States Patent
Lee et al.

(10) Patent No.: US 12,684,999 B2
(45) Date of Patent: Jul. 14, 2026

(54) LIGHT EMITTING DISPLAY DEVICE AND MANUFACTURING METHOD THEREOF

(71) Applicant: Samsung Display Co., Ltd., Yongin-Si (KR)

(72) Inventors: Hyeon Bum Lee, Hwaseong-si (KR); Hye Kyung Park, Yongin-si (KR); Chi Wook An, Hwaseong-si (KR); Hyun Duck Cho, Anyang-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 738 days.

(21) Appl. No.: 17/570,183

(22) Filed: Jan. 6, 2022

(65) Prior Publication Data

US 2023/0354679 A1     Nov. 2, 2023

(30) Foreign Application Priority Data

Jun. 29, 2021     (KR) ........................ 10-2021-0084535

(51) Int. Cl.
| | |
|---|---|
| *H10K 59/80* | (2023.01) |
| *G09G 3/3233* | (2016.01) |
| *H10K 59/12* | (2023.01) |
| *H10K 59/122* | (2023.01) |

(52) U.S. Cl.
CPC ....... *H10K 59/8792* (2023.02); *G09G 3/3233* (2013.01); *H10K 59/1201* (2023.02); *H10K 59/122* (2023.02); *G09G 2300/0426* (2013.01); *G09G 2300/0819* (2013.01); *G09G 2300/0842* (2013.01); *G09G 2300/0861* (2013.01)

(58) Field of Classification Search
CPC ... H10K 59/8792; H10K 59/38; H10K 59/122
See application file for complete search history.

(56) References Cited

U.S. PATENT DOCUMENTS

| | | | |
|---|---|---|---|
| 2018/0182814 A1* | 6/2018 | Kim | .................... H10K 59/8792 |
| 2019/0013363 A1 | 1/2019 | Joo et al. | |
| 2020/0091247 A1* | 3/2020 | Lee | ....................... H10K 77/111 |
| 2020/0119113 A1* | 4/2020 | Lee | ........................ H10K 50/11 |
| 2020/0194502 A1* | 6/2020 | Joo | ....................... H10K 50/865 |
| 2020/0212109 A1 | 7/2020 | Lee et al. | |
| 2020/0251528 A1 | 8/2020 | Lee | |

(Continued)

FOREIGN PATENT DOCUMENTS

| | | | | |
|---|---|---|---|---|
| CN | 111179749 | * | 5/2020 | ............. H10K 59/38 |
| KR | 10-2007-0119261 A | | 12/2007 | |

(Continued)

*Primary Examiner* — Mary A Wilczewski
(74) *Attorney, Agent, or Firm* — Innovation Counsel LLP

(57) ABSTRACT

A light emitting display device and its manufacturing method are presented. The device includes: a substrate; a pixel circuit unit positioned on the substrate; a light emitting diode (LED) electrically connected to the pixel circuit unit; an encapsulation layer covering the pixel circuit unit and the light emitting diode (LED); a light blocking layer disposed on the encapsulation layer and having a first opening, a second opening, and a third opening; a first color filter including a main part in the first opening and an overlapping part connecting adjacent main parts and covering the light blocking layer; a second color filter in the second opening; and a third color filter in the third opening.

18 Claims, 19 Drawing Sheets

(56)     References Cited

U.S. PATENT DOCUMENTS

| | | | |
|---|---|---|---|
| 2020/0312926 A1 | 10/2020 | Bae et al. | |
| 2020/0313108 A1* | 10/2020 | Jang ...................... | C09K 11/08 |
| 2021/0005845 A1* | 1/2021 | Kim .................... | H10K 50/858 |
| 2024/0036672 A1* | 2/2024 | Shim .................. | H10K 59/8792 |
| 2024/0349540 A1* | 10/2024 | Lee ..................... | H10K 59/879 |
| 2025/0072222 A1* | 2/2025 | Choi ................. | H10K 59/8791 |
| 2025/0098502 A1* | 3/2025 | Kim .................... | H10K 59/122 |
| 2025/0176361 A1* | 5/2025 | Choi ................... | H10K 59/873 |

FOREIGN PATENT DOCUMENTS

| | | | |
|---|---|---|---|
| KR | 10-2010-0056437 A | 5/2010 | |
| KR | 10-2015-0129551 A | 11/2015 | |
| KR | 10-2019-0004874 A | 1/2019 | |
| KR | 10-2020-0083745 A | 7/2020 | |
| KR | 10-2020-0096357 A | 8/2020 | |
| KR | 10-2020-0115888 A | 10/2020 | |
| KR | 10-2021-0000184 A | 1/2021 | |

* cited by examiner

LIGHT EMITTING DISPLAY DEVICE AND MANUFACTURING METHOD THEREOF

CROSS-REFERENCE TO RELATED APPLICATION

This application claims priority to and the benefit of Korean Patent Application No. 10-2021-0084535 filed in the Korean Intellectual Property Office on Jun. 29, 2021, the entire contents of which are incorporated herein by reference.

BACKGROUND

1. Field

The present disclosure relates to a light emitting display device and a manufacturing method thereof, and in detail, to a structure of a color filter positioned at an upper part of a light emitting display device and a manufacturing method thereof.

2. Description of the Related Art

A display device is a device that displays images, and may be a liquid crystal display (LCD), an organic light emitting diode (OLED) display, and the like. The display device is used in various electronic devices such as a mobile phone, a navigation device, a digital camera, an electronic book, a portable game machine, and various terminals.

A display device such as the organic light emitting display device may have a structure in which the display device can be bent or folded by using a flexible substrate. The organic light emitting display device has drawbacks such as a more complex pixel structure than the liquid crystal display, a large number of layers formed on the top, a large number of masks used, and a complicated manufacturing process.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a light emitting display device capable of forming a color filter by reducing the number of masks and a manufacturing method thereof.

A light emitting display device according to an embodiment includes: a substrate; a pixel circuit unit positioned on the substrate; a light emitting diode (LED) electrically connected to the pixel circuit unit; an encapsulation layer covering the pixel circuit unit and the light emitting diode (LED); a light blocking layer disposed on the encapsulation layer and having a first opening, a second opening, and a third opening; a first color filter including a main part in the first opening and an overlapping part connecting adjacent main parts and covering the light blocking layer; a second color filter in the second opening; and a third color filter in the third opening.

The overlapping part may cover the light blocking layer.

The first color filter may have a color filter opening aligned with the second opening and the third opening.

The color filter opening of the first color filter may align with the second opening and the third opening of the light blocking layer, and the second opening and the third opening may be smaller than the color filter opening of the first color filter in plan view.

The light emitting diode (LED) may include an anode, an emission layer, and a cathode, and a black pixel defining layer including a light blocking material that is covering the edge of the anode and having an opening aligned with the anode.

The opening of the black pixel defining layer is aligned with the first opening, the second opening, and the third opening of the light blocking layer, and the opening of the black pixel defining layer may be smaller than the first opening, the second opening, and the third opening in plan view.

The second color filter, the third color filter, the first opening, the second opening, and the third opening of the light blocking layer, the color filter opening of the first color filter, and the opening of the black pixel defining layer may have the same shape in plan view, or a chamfered version of the same shape.

A detecting aligned with the light blocking layer and the overlapping part may be included.

The light emitting display device may further include a photosensor area through which light can pass, and an additional opening formed in the first color filter, the light blocking layer, and the black pixel defining layer in the photosensor area.

The additional opening of the first color filter positioned in the photosensor area may be integrally formed with the adjacent color filter opening.

Three color filter openings positioned adjacent to the photosensor area and two additional openings of the first color filter may be integrally formed.

The additional opening of the light blocking layer may be aligned with and smaller than the additional opening of the first color filter in plan view, and the additional opening of the black pixel defining layer may be aligned with and smaller than the additional opening of the light blocking layer in plan view.

A detecting electrode aligned with the light blocking layer and the overlapping part may be further included in the light emitting display device.

The light emitting display device may include a component area positioned at the periphery of the photosensor area and having a light transmitting area.

There may be a plurality of photosensor areas.

A spacer positioned on the black pixel defining layer and having a step may be further included.

The second color filter and the third color filter may be formed by an inkjet method.

A manufacturing method of a light emitting display device according to an embodiment includes: forming a light blocking layer including a first opening, a second opening, and a third opening on an encapsulation layer; forming a first color filter having a color filter opening at each portion aligned with the second opening and the third opening by using a mask after disposing an organic material for the first color filter on the encapsulation layer; completing a second color filter by forming an organic material for the second color filter in the second opening on a plane by an inkjet method; and completing a third color filter by forming an organic material for the third color filter in the third opening by an inkjet method.

The second color filter and the third color filter may be formed after the first color filter.

The second color filter and the third color filter may be formed before the first color filter.

According to embodiments, only the color filter of one color is formed using a mask, and the remaining two color filters are formed in the openings formed in the color filter or the light blocking layer by the inkjet method, thereby reducing the number of masks used.

DETAILED DESCRIPTION

Figure 1:
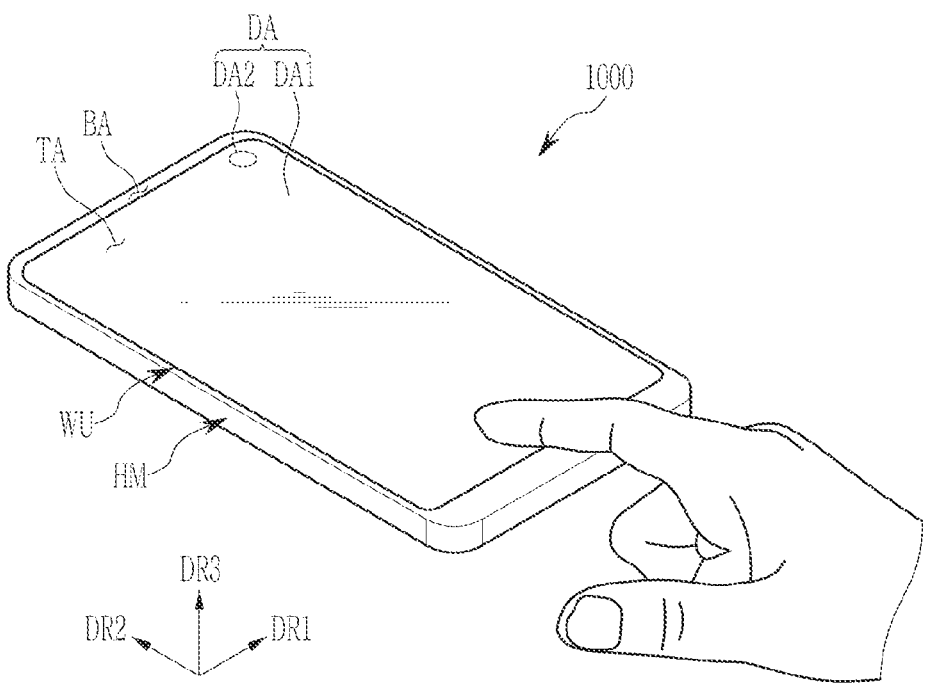
FIG. 1 is a schematic perspective view depicting a use state of a display device according to an embodiment.

The inventive concept will be described more fully hereinafter with reference to the accompanying drawings, in which exemplary embodiments of the disclosure are shown. As those skilled in the art would realize, the described embodiments may be modified in various different ways, all without departing from the spirit or scope of the present invention.

Descriptions of parts not related to the present disclosure are omitted, and like reference numerals designate like elements throughout the specification.

Further, since sizes and thicknesses of constituent members shown in the accompanying drawings are chosen for better understanding and ease of description rather than accuracy of scale, the present invention is not limited to the illustrated sizes and thicknesses. In the drawings, the thicknesses of layers, films, panels, areas, etc., are exaggerated for clarity. In the drawings, for better understanding and ease of description, the thicknesses of some layers and areas are exaggerated.

It will be understood that when an element such as a layer, film, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "on a plane" means when an object portion is viewed from above in plan view, and the phrase "on a cross-section" means an object portion is cut and the surface that is revealed by the cutting is viewed.

As used herein, when one part is "aligned with" another part, one part is on top of the other such that a straight line in the direction DR3 (defined below) intersects both parts. When a first part is "smaller than" a second part, the boundaries of the first part enclose an area that is smaller than the boundaries of the second part in plan view.

Hereinafter, a schematic structure of a light emitting display device is described with reference to FIG. 1 to FIG. 3.

Figure 2:
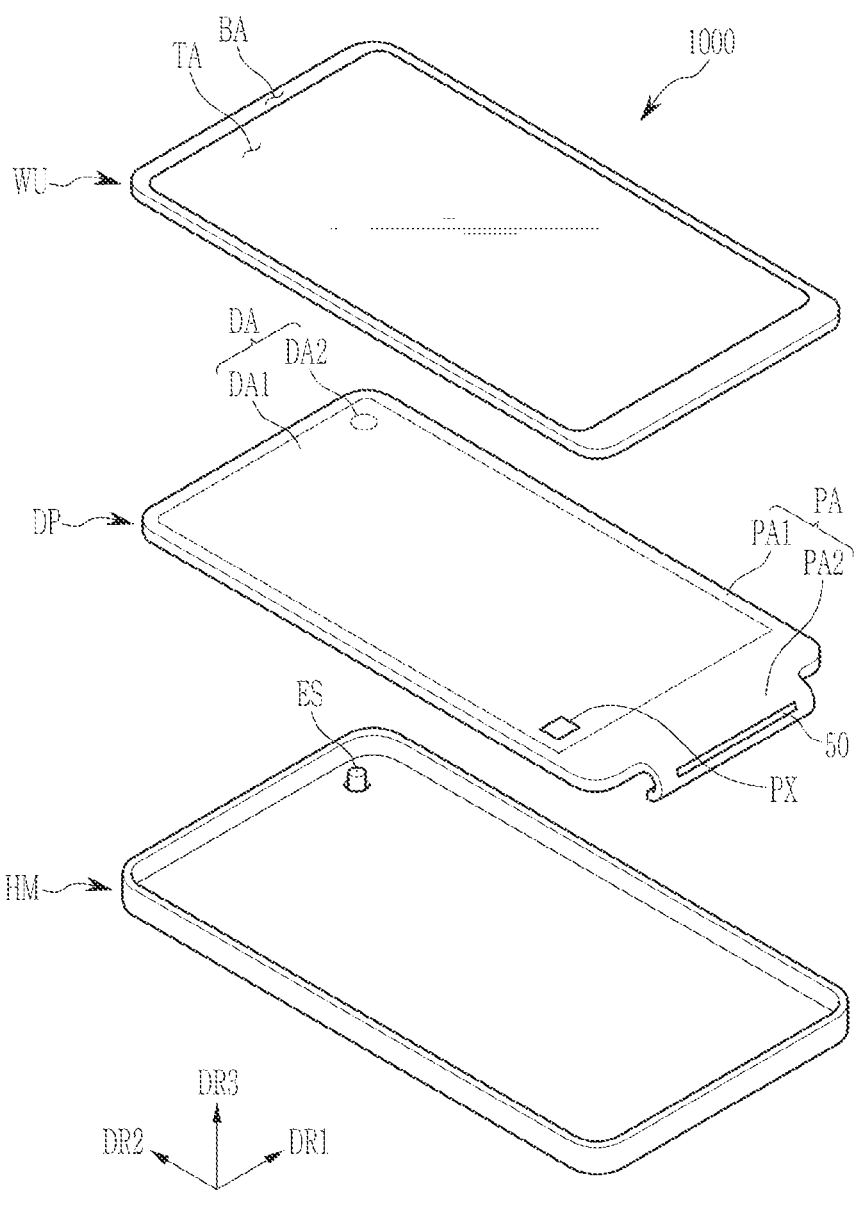
FIG. 2 is an exploded perspective view of a display device according to an embodiment.
Figure 3:
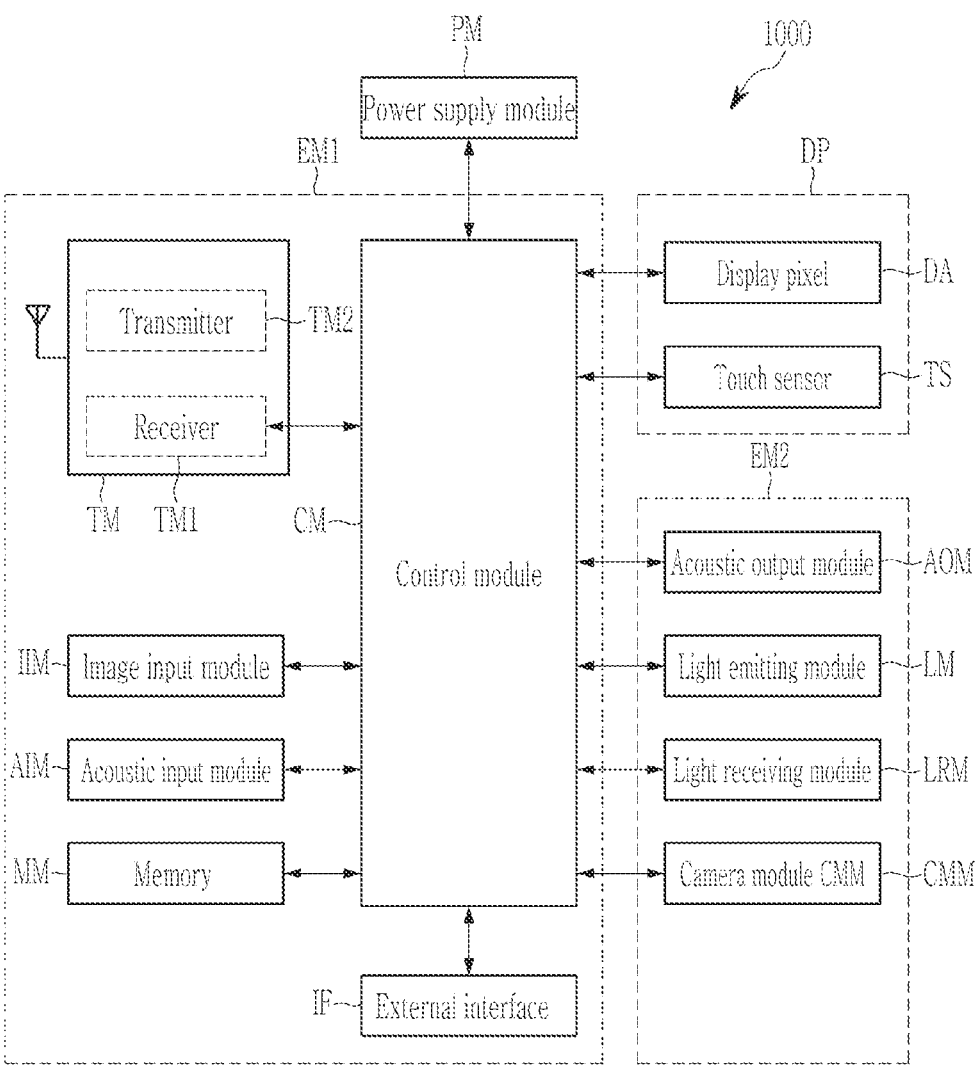
FIG. 3 is a block diagram of a display device according to an embodiment.

FIG. 1 is a schematic perspective view showing a use state of a display device according to an embodiment, FIG. 2 is an exploded perspective view of a display device according to an embodiment, and FIG. 3 is a block diagram of a display device according to an embodiment.

A light emitting display device 1000 according to an embodiment may display a moving image or a static image, and may be used as a display screen of various products such as a television, a laptop, a monitor, a billboard, an Internet of things (IOT), as well as a portable electronic device such as a mobile phone, a smart phone, a tablet personal computer, a mobile communication terminal, an electronic notebook, an electronic book, a portable multimedia player (PMP), a navigation device, an ultra-mobile PC (UMPC), etc. Also, the light emitting display device 1000 according to an embodiment may be used in wearable devices such as a smart watch, a watch phone, a spectacle display, a head mounted display (HMD), etc. Also, the light emitting display device 1000 according to an embodiment may be used as an instrument panel of a vehicle, a center fascia of a vehicle or a center information display (CID) disposed on a dashboard, a room mirror display instead of a side mirror of a vehicle, an entertainment unit for a back seat of a vehicle, or a display disposed at a rear surface of a front seat. FIG. 1 shows the light emitting display device 1000 according to an embodiment used as a smartphone for convenience of explanation.

Referring to FIG. 1, FIG. 2, and FIG. 3, the light emitting display device 1000 may display the image toward a third direction DR3 on a display surface that is perpendicular to a first direction DR1 and a second direction DR2. The display surface on which the image is displayed may correspond to the front surface of the light emitting display device 1000 and may correspond to the front surface of the cover window WU. The images may include static images as well as dynamic moving images.

In the present embodiment, the front (or a top) and the back (or a bottom) of each member are defined based on the direction in which the image is displayed. The front and rear surfaces may be opposed to each other in the third direction DR3, and the normal directions of the front and rear surfaces may be parallel to the third direction DR3. The separation distance in the third direction DR3 between the front and rear surfaces may correspond to the thickness in the third direction DR3 of the light emitting display panel DP.

The light emitting display device 1000 according to an embodiment may detect the user's input (refer to a hand in FIG. 1) applied from the outside. The user's input may include various types of external inputs such as a part of the user's body, light, heat, or pressure. In an embodiment, the user's input is shown with the user's hand applied to the front. However, the present invention is not limited thereto. The user's input may be provided in various forms, and the light emitting display device 1000 may sense the user's input applied to the side or rear of the light emitting display device 1000 according to the structure of the light emitting display device 1000.

The light emitting display device 1000 may include a display area DA and non-display area PA disposed around the display area DA. Meanwhile, the display area DA may be largely divided into a first display area DA1 and a first element area DA2 (hereinafter also referred to as a component area or a second display area), and in an embodiment, the first display area DA1 may include a plurality of pixels for displaying an image, and the first element area DA2 may include a light transmitting area, and may additionally also include a pixel that displays the image. The first element area DA2 may be an area overlapping at least partially with an optical element ES such as a camera or an optical sensor. FIG. 1 shows that the first element area DA2 is provided in a circle shape on the upper right side of the light emitting display device 1000, but the present invention is not limited thereto. The first element area DA2 may be provided in various numbers and shapes according to the number and shape of the optical element ES.

The light emitting display device 1000 may receive an external signal required for the optical element ES through the first element area DA2, or may externally provide a signal output from the optical element ES. In an embodiment, since the first element area DA2 is provided to overlap the light transmitting area, the area of the blocking area BA for forming the light transmitting area may be reduced. Here, the blocking area BA is a region having relatively low light transmittance, and may include a bezel area.

The light emitting display device 1000 may include a cover window WU, a housing HM, a light emitting display panel DP, and an optical element ES. In an embodiment, the cover window WU and the housing HM may be combined to constitute the appearance of the light emitting display device 1000.

The cover window WU may include an insulating panel. For example, the cover window WU may be made of glass, plastic, or a combination thereof.

The front surface of the cover window WU may define the front surface of the light emitting display device 1000. The transmitting area TA may be an optically transparent area. For example, the transmitting area TA may be an area having visible ray transmittance of about 90% or more.

The blocking area BA may define the shape of the transmitting area TA. The blocking area BA may be adjacent to the transmitting area TA and may surround the transmitting area TA. The blocking area BA may be an area having relatively low light transmittance compared to the transmitting area TA. The blocking area BA may include an opaque material that blocks light. The blocking area BA may have a predetermined color. The blocking area BA may be defined by a transparent substrate defining the transmitting area TA and a bezel layer provided separately, or by an ink layer formed by being inserted or colored into the transparent substrate.

The light emitting display panel DP may include a display panel DP for displaying the image, a touch sensor TS for detecting an external input, and a driving unit 50. The light emitting display panel DP may include a front surface including a display area DA and a non-display area PA. The display area DA may be an area in which a pixel operates and emits light according to an electrical signal.

In an embodiment, the display area DA is an area where the image is displayed by including a pixel, and simultaneously may be an area where the touch sensor TS is positioned on the upper side in the third direction DR3 of the pixel and an external input is sensed.

The transmitting area TA of the cover window WU may overlap at least partially with the display area DA of the light emitting display panel DP. For example, the transmitting area TA may overlap the entire surface of the display area DA or may overlap at least a part of the display area DA. Accordingly, the user may view the image through the transmitting area TA or provide an external input based on the image. However, the present invention is not limited thereto. For example, in the display area DA, the area in which the image is displayed and the area in which the external input is detected may be separated from each other.

The non-display area PA of the light emitting display panel DP may at least partially overlap with the blocking area BA of the cover window WU. The non-display area PA may be an area covered by the blocking area BA. The non-display area PA is adjacent to the display area DA and may surround the display area DA. The image is not displayed in the non-display area PA, and a driving circuit or driving wiring for driving the display area DA may be disposed there. The non-display area PA may include a first peripheral area PA1 positioned outside the display area DA and a second peripheral area PA2 including a driving unit 50, connection wiring, and a bending area. In the embodiment of FIG. 2, the first peripheral area PA1 is positioned on three sides of the display area DA, and the second peripheral area PA2 is positioned on the other side of the display area DA.

In an embodiment, the light emitting display panel DP may be assembled in a flat state such that the display area DA and the non-display area PA face the cover window WU. However, the present disclosure is not limited thereto. A part of the non-display area PA of the light emitting display panel DP may be bent. In this case, a portion of the non-display area PA faces the rear surface of the light emitting display device 1000, so that the blocking area BA shown on the front surface of the light emitting display device 1000 may be reduced, and as shown in FIG. 2, the second peripheral area PA2 is bent to be positioned on the back surface of the display area DA and then assembled.

The display area DA may include a first display area DA1 and a first element area DA2. The first element area DA2 may have relatively high light transmittance compared to the first display area DA1 by including the light transmitting area. Also, the first element area DA2 may have a relatively smaller area than the first display area DA1. The first element area DA2 may be defined as an area overlapping the area where the optical element ES is disposed inside the housing HM among the light emitting display panel DP. In an embodiment, the first element area DA2 is shown with a circle shape, but the present invention is not limited thereto, and the first element area DA2 may have various shapes such as polygons, ellipses, and figures with at least one curved line.

The first display area DA1 may be adjacent to the first element area DA2. In an embodiment, the first display area DA1 may surround the entirety of the first element area DA2. However, this is not a limitation of the disclosure. The first display area DA1 may partially surround the first element area DA2.

Referring to FIG. 3, the light emitting display panel DP may include a display area DA including a display pixel and a touch sensor TS. The light emitting display panel DP may be visually recognized by the user from the outside through the transmitting area TA, including the pixel that generates the image. In addition, the touch sensor TS may be positioned on the upper part of the pixel, and may sense the external input applied from the outside. The touch sensor TS may detect an external input provided to the cover window WU.

Again referring to FIG. 2, the second peripheral area PA2 may include a bent part. The display area DA and the first peripheral area PA1 may have a flat state while being substantially parallel to the plane defined by the first direction DR1 and the second direction DR2, and one side of the second peripheral area PA2 is extended from the flat state and may again have the flat state after passing the bending part. As a result, at least a part of the second peripheral area PA2 may be bent and assembled to be positioned on the back side of the display area DA. At least part of the second peripheral area PA2 overlaps the display area DA on a plane when being assembled, so that the blocking area BA of the light emitting display device 1000 may be reduced. However, this is not a limitation of the disclosure. For example, the second peripheral area PA2 may not be bent.

The driving unit 50 may be mounted on the second peripheral area PA2, mounted on the bending part, or positioned on one of both sides of the bending part. The driving unit 50 may be provided in a form of a chip.

The driving unit 50 may be electrically connected to the display area DA to transmit an electrical signal to the display area DA. For example, the driving unit 50 may provide data signals to the pixels PX disposed in the display area DA. Alternatively, the driving unit 50 may include a touch driving circuit and may be electrically connected to the touch sensor TS disposed in the display area DA. Meanwhile, the driving unit 50 may include various circuits in addition to the above-described circuits or may be designed to provide various electrical signals to the display area DA.

On the other hand, a pad part may be positioned on the end of the second peripheral area PA2, and the light emitting display device 1000 may be electrically connected to a flexible printed circuit board (FPCB) including the driving chip by the pad part. Here, the driving chip positioned on the flexible printed circuit board may include various driving circuits for driving the light emitting display device 1000 or connectors for power supply. According to an embodiment, instead of the flexible printed circuit board, a rigid printed circuit board (PCB) may be used.

The optical element ES may be disposed under the light emitting display panel DP. The optical element ES may receive an external input transmitted through the first element area DA2 or may output a signal through the first element area DA2. In an embodiment, the first element area DA2 having relatively high transmittance is provided inside the display area DA, so that the optical element ES may be disposed to overlap the display area DA, and accordingly, the area (or the size) of the blocking area BA may be reduced.

Referring to FIG. 3, light emitting display device 1000 may include a light emitting display panel DP, a power supply module PM, a first electric module EM1, and a second electric module EM2. The light emitting display panel DP, the power supply module PM, the first electric module EM1, and the second electric module EM2 may be electrically connected to each other. In FIG. 3, the display pixel and the touch sensor TS positioned in the display area DA among the configuration of the light emitting display panel DP are illustrated as an example. Most of the parts depicted in FIG. 3 are commercially available, well-known parts.

The power supply module PM may supply the power required for the overall operation of the light emitting display device 1000. The power supply module PM may include a conventional battery module.

The first electric module EM1 and the second electric module EM2 may include various functional modules for operating the light emitting display device 1000. The first electric module EM1 may be directly mounted on a motherboard electrically connected to the display panel DP or mounted on a separate substrate to be electrically connected to the motherboard through a connector (not shown).

The first electric module EM1 may include a control module CM, a wireless communication module TM, an image input module IIM, an acoustic input module AIM, a memory MM, and an external interface IF. Some of the modules are not mounted on the motherboard, but may be electrically connected to the motherboard through the flexible printed circuit board connected thereto.

The control module CM may control the overall operation of the light emitting display device 1000. The control module CM may be a microprocessor. For example, the control module CM activates or deactivates the display panel DP. The control module CM may control other modules such as the image input module IIM or the acoustic input module AIM based on the touch signal received from the display panel DP.

The wireless communication module TM may transmit/receive a wireless signal with another terminal by using a Bluetooth or Wi-Fi line. The wireless communication module TM may transmit/receive a voice signal using a general communication line. The wireless communication module TM includes a transmitter TM1 that modulates and transmits a signal to be transmitted, and a receiver TM2 that demodulates a received signal.

The image input module TIM may process the image signal to be converted into image data that can be displayed on the light emitting display panel DP. The acoustic input module AIM may receive an external sound signal input by a microphone in a recording mode, a voice recognition mode, etc. to be converted into electrical voice data.

The external interface IF may serve as an interface connected to an external charger, a wired/wireless data port, a card socket (e.g., a memory card, SIM/SIM card), and the like.

The second electric module EM2 may include an acoustic output module AOM, a light emitting module LM, a light receiving module LRM, and a camera module CMM, and at least some of these may be positioned on the back of the display area DA as the optical element ES as shown in FIG. 1 and FIG. 2. The optical element ES may include the light emitting module LM, the light receiving module LRM, and the camera module CMM. In addition, the second electric module EM2 may be directly mounted on the motherboard or mounted on a separate substrate to be electrically connected to the light emitting display panel DP through a connector (not shown), or electrically connected to the first electric module EM1.

The acoustic output module AOM may convert the acoustic data received from the wireless communication module TM or the acoustic data stored in the memory MM to sound output.

The light emitting module LM may generate and output light. The light emitting module LM may output infrared light. For example, the light emitting module LM) may include an LED element. For example, the light-receiving module LRM may detect infrared light. The light receiving module LRM may be activated when infrared light above a certain level is detected. The light receiving module LRM may include a CMOS sensor. After the infrared light generated by the light emitting module LM is output, the light may be reflected by an external subject (e.g., a user's finger or a face), and the reflected infrared light may be incident on the light receiving module LRM. The camera module CMM may take external images.

In an embodiment, the optical element ES may additionally include an optical detecting sensor or a thermal detecting sensor. The optical element ES may detect an external object received through the front surface or may provide a sound signal such as a voice through the front surface to the outside. Also, the optical element ES may include a plurality of configurations, and is not limited to any one embodiment.

Again referring to FIG. 2, the housing HM may be combined with the cover window WU. The cover window WU may be disposed in front of the housing HM. The housing HM may be combined with the cover window WU to provide a predetermined accommodation space. The light emitting display panel DP and the optical element ES may be accommodated in a predetermined accommodation space provided between the housing HM and the cover window WU.

The housing HM may include a material with relatively high rigidity. For example, the housing HM may include a plurality of frames and/or plates made of glass, plastic, or metal, or a combination thereof. The housing HM may reliably protect the components of the light emitting display device 1000 housed in the interior space from external impact.

Hereinafter, the structure of the light emitting display device 1000 according to another embodiment is described with reference to FIG. 4.

Figure 4:
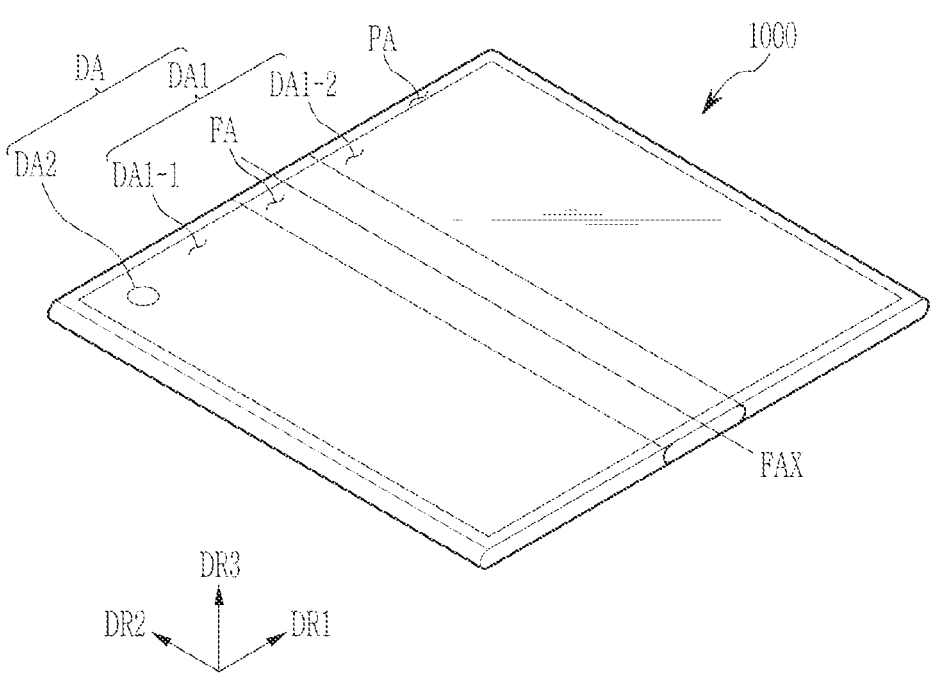
FIG. 4 is a perspective view schematically depicting a light emitting display device according to another embodiment.

FIG. 4 is a perspective view schematically showing a light emitting display device according to another embodiment.

The embodiment FIG. 4 shows a foldable light emitting display device in which the light emitting display device 1000 is folded through a folding line (FAX).

In the foldable light emitting display device, the first element area DA2 (hereinafter referred to as a component area) may be disposed on an edge of one side as shown in FIG. 4.

The optical element such as a camera or an optical sensor is positioned on the back of the first element area DA2 of FIG. 4, and the light transmitting area is positioned in the first element area DA2.

Referring to FIG. 4, in an embodiment, the light emitting display device 1000 may be the foldable light emitting display device. The light emitting display device 1000 may be folded outward or inward based on the folding axis FAX. When being folded outward based on the folding axis FAX, the display surfaces of the light emitting display device 1000 are respectively positioned on the outside in the third direction DR3, so that the images may be displayed in both directions. When being folded inward based on the folding axis FAX, the display surface may not be visible from the outside.

The light emitting display device 1000 may include the housing, the light emitting display panel, and the cover window.

In an embodiment, the light emitting display panel may include the display area DA and the non-display area PA. The display area DA is an area in which the image is displayed and may simultaneously be an area in which an external input is sensed. The display area DA may be an area in which a plurality of pixels to be described later are disposed.

The display area DA may include the first display area DA1 and the first element area DA2. Also, the first display area DA1 may be divided in to a first/first display area DA1-1, a first/first element area DA1-2, and a folding area FA. The first/first display area DA1-1 and the first/first element area DA1-2 may be positioned on the left and right sidesof the folding axis FAX, and the folding area FA may be positioned between the first/first display area DA1-1 and the first/first element area DA1-2. At this time, when being folded outward based on the folding axis FAX, the first/first display area DA1-1 and the first/first element area DA1-2 are positioned on both sides in the third direction DR3, and the images may be displayed in both directions. In addition, when being folded inward based on the folding axis FAX, the first/first display area DA1-1 and the first/first element area DA1-2 may not be visible from the outside.

Hereinafter, the structure of the light emitting display panel DP according to an embodiment is described with reference to FIG. 5.

Figure 5:
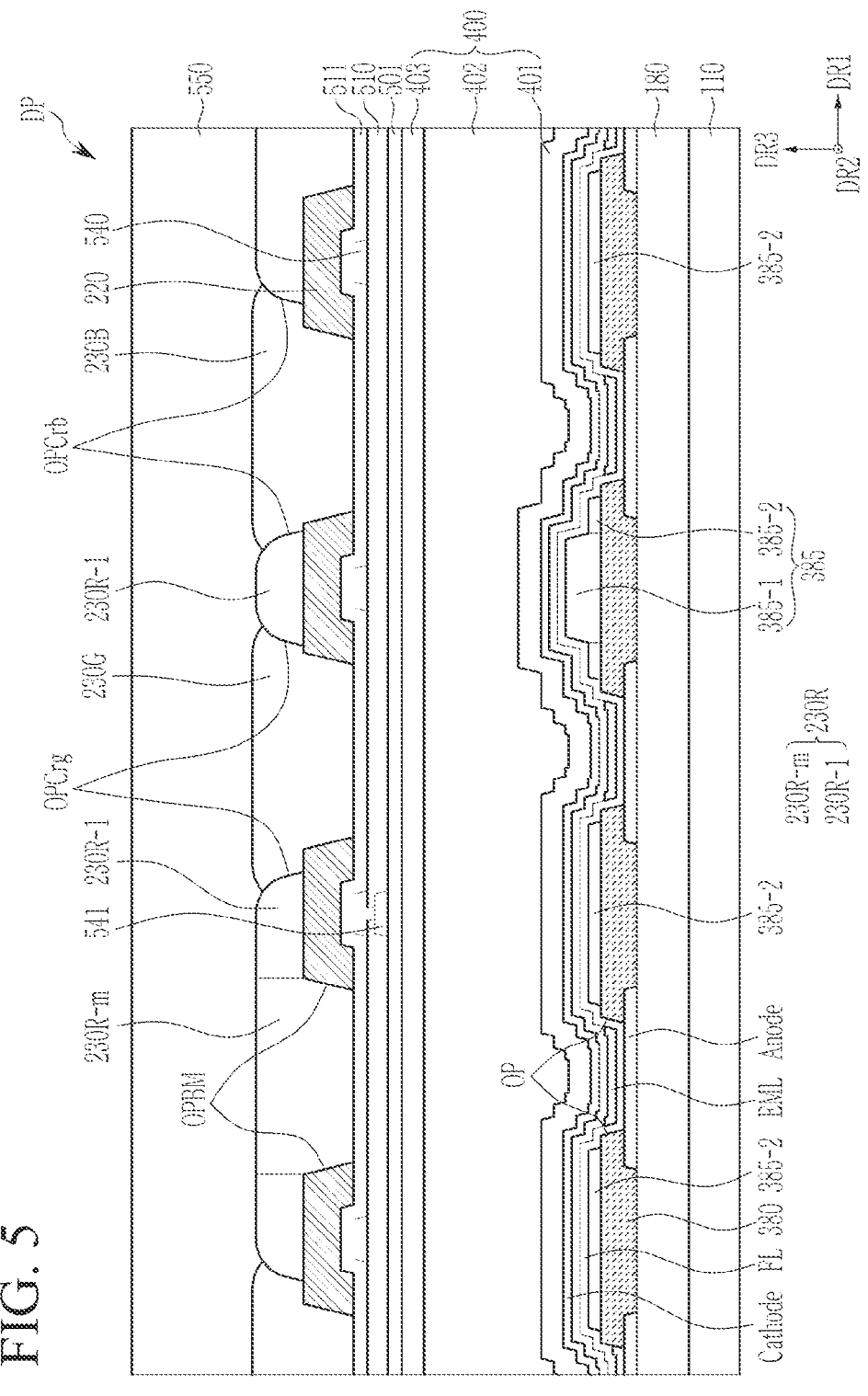
FIG. 5 is a schematic cross-sectional view of a light emitting display device according to an embodiment.

FIG. 5 is a schematic cross-sectional view of a light emitting display device according to an embodiment.

The light emitting display panel DP according to an embodiment may display the image by forming the light emitting diode (LED) on the substrate 110 and detect the touch by including a plurality of detecting electrodes 540 and 541, and may include a light blocking layer 220 and color filters 230R, 230G, and 230B so that light emitted from the light emitting diode (LED) has a color characteristic of the color filters 230R, 230G, and 230B.

Figure 6:
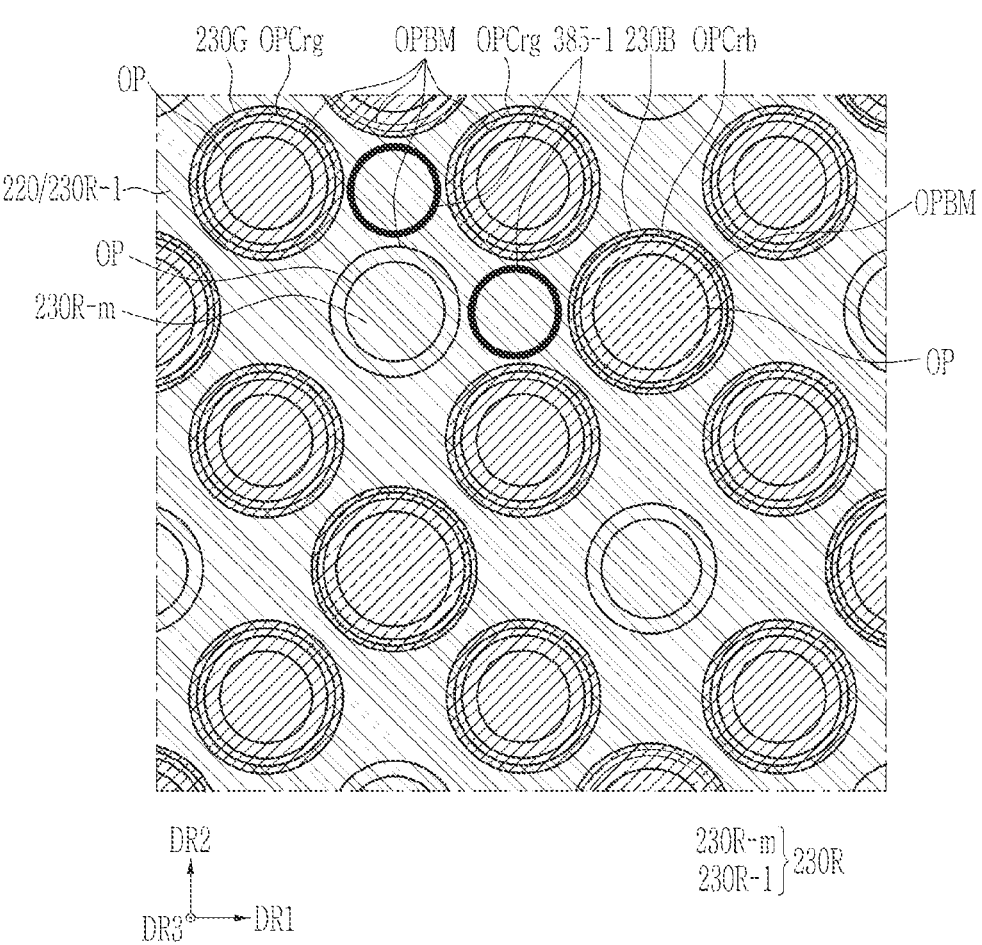
FIG. 6 is a top plan view of a part of an upper panel layer of a light emitting display device according to an embodiment.
Figure 8:
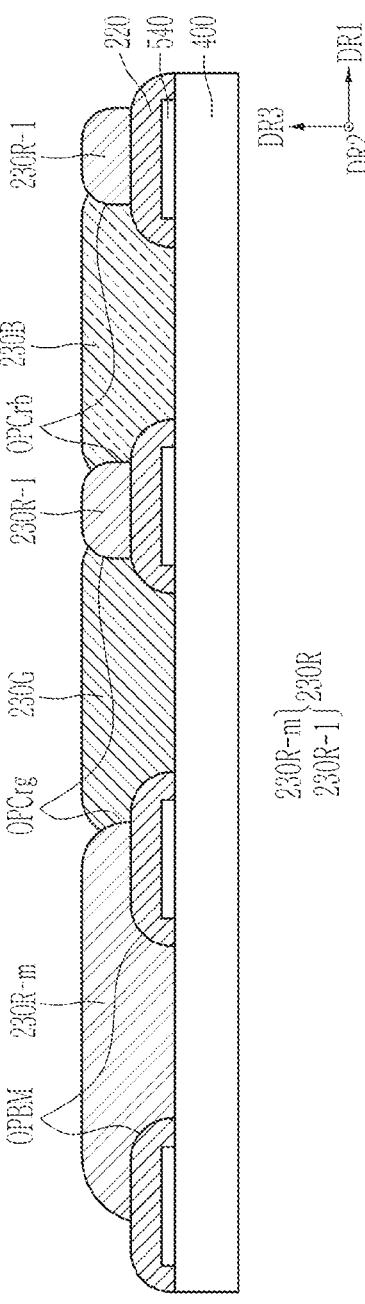
FIG. 8 is a schematic cross-sectional view of a part of a light emitting display device according to an embodiment of FIG. 7.

The light blocking layer 220 is a layer formed on the encapsulation layer 400 that has at least one opening OPBM corresponding to each color filter 230R, 230G, and 230B. Each color filter 230R, 230G, and 230B overlaps the corresponding opening OPBM of the light blocking layer 220 on a plane and fills the corresponding opening OPBM. A color filter layer including red color filter 230R, green color filter 230G, and blue color filter 230B are formed on the light blocking layer and in the openings OPBM in the light blocking layer. Initially, the color filter layer is just one color of color filter (the red color filter 230R in the embodiment of FIG. 5) disposed on the encapsulation layer 400. Parts of the color filter layer are moved to form a color filter opening (also referring to OPCrg, OPCrb as shown in FIG. 6 and FIG. 8) in the locations corresponding to the other two color filters 230G and 230B. As a result, the red color filter (an overlapping part 230R-1) is positioned on the light blocking layer 220. That is, the red color filter 230R is formed on the light blocking layer 220, and the red color filter 230R-m (hereinafter referred to as a main part) is additionally formed in the opening OPBM for the red color filter 230R among the openings OPBM in the light blocking layer 220. The red color filter 230R may have a structure including a main part 230R-m positioned in the opening OPBM for the red color filter 230R of the light blocking layer 220 and an overlapping part 230R-1 connecting the adjacent main parts 230R-m and overlapping the light blocking layer 220 on a plane. Here, openings may be formed in the color filter 230R or 230G or 230B (the red color filter 230R in the embodiment of FIG. 5) formed on the encapsulation layer 400*by* using a mask, and the remaining color filters 230G and 230B may be formed by using the inkjet method to deposit the color filter material in the opening of the color filter or the light blocking layer 220. The remaining color filters 230G and 230B may have a structure that positions only the portion overlapping with the remaining openings OPBM of the light blocking layer 220, fills the inside of the opening OPBM, and may also overflow to cover edge parts of the light blocking layer 220.

In addition, a polarizer is not formed on the front surface of the light emitting display panel DP according to an embodiment, and the light blocking layer 220 and the color filter 230 are formed on the upper part while using a black pixel defining layer 380 instead thereof, so even if external light is incident inside, the external light is blocked by the black pixel defining layer 380 and not reflected to the outside, thereby it may be prevented from being transmitted to the user. In this case, the black pixel defining layer 380 may be formed of a black color organic material including a light blocking material.

The light emitting display panel DP of FIG. 5 may have a spacer 385 having a stepped structure on the black pixel defining layer 380. The spacer 385 incudes a first portion 385-1 having a high height and a second portion 385-2 that is lower than the first portion 385-1 and positioned around the first portion 385-1. The spacer 385 may reduce defects due to a pressure by increasing scratch strength of the light emitting display device DP, and also increase adherence with a functional layer FL positioned on the spacer 385, thereby preventing moisture and air from permeating from the outside. In addition, high adherence may eliminate a problem of the adherence between layers failing when the light emitting display panel DP has a flexible characteristic and is folded and unfolded.

The light emitting display panel DP according to an embodiment FIG. 5 is described in detail as follows.

The substrate 110 may include a material that does not bend due to a rigid characteristic such as glass, or a flexible material that can be bent, such as plastic or polyimide.

A plurality of thin film transistors are formed on the substrate 110, but are omitted in FIG. 5, and only the organic layer 180 covering the thin film transistor is shown.

One pixel includes a pixel circuit unit in which a light emitting diode (LED) and a plurality of transistors and a capacitor for transmitting a light emitting current to the light emitting diode (LED) are formed. In FIG. 5, the pixel circuit unit is not shown, and the structure of the pixel circuit unit may vary according to an embodiment, but an embodiment will be described later in FIG. 18 and FIG. 19. The configurations from the organic layer 180 covering the pixel circuit unit are shown in FIG. 5.

On the organic layer 180, a light emitting diode (LED) including an anode (Anode), an emission layer EL, and a cathode (Cathode) is positioned.

The anode (Anode) may be composed of a single layer including a transparent conductive oxide film and a metal material, or a multi-layer including the same. The transparent conductive oxide layer may include ITO (Indium Tin Oxide), poly-ITO, IZO (Indium Zinc Oxide), IGZO (Indium Gallium Zinc Oxide), ITZO (Indium Tin Zinc Oxide), etc., and the metal material may include silver (Ag), molybdenum (Mo), copper (Cu), gold (Au), aluminum (Al), etc.

The emission layer EML may be formed of an organic light emitting material, and adjacent emission layers EML may display different colors. On the other hand, according to an embodiment, each of the emission layer EML may display light of the same color due to the color filters 230R, 230G, and 230B positioned on the upper part.

A black pixel defining layer 380 is positioned on the organic layer 180 and the anode (Anode), the black pixel defining layer 380 includes an opening OP, the opening overlaps a part of the anode (Anode), and the emission layer EML is positioned on the anode (Anode) exposed by the opening OP. The emission layer EML may be positioned only within the opening of the black pixel defining layer 380, and is separated from the adjacent emission layer EML by the black pixel defining layer 380. The black pixel defining layer 380 may be formed of an organic material having a negative type of black color. An organic material having the black color may be used as the light blocking material, and the light blocking material may include carbon black, carbon nanotubes, a resin or paste containing a black dye, metal particles, for example, nickel, aluminum, molybdenum, and alloys thereof, metal oxide particles (e.g., chromium nitride), etc. The black pixel defining layer 380 may have a black color by including a light blocking material, and may have a characteristic of absorbing/blocking light instead of reflecting light. Where the negative type is used as the organic material, parts covered by the mask is removed.

The spacer 385 is formed on the black pixel defining layer 380. The spacer 385 includes a first portion 385-1 having a first height and positioned in a narrow area, and a second portion 385-2 having a second height and positioned in a wide area. The first height is greater than the second height. In FIG. 5, the first portion 385-1 and the second portion 385-2 are indicated to be separated through a line in the spacer 385, respectively. Here, the first portion 385-1 may provide rigidity against the pressure. The second portion 385-2 may serve as a contact assistant between the black pixel defining layer 380 and the overlying functional layer FL. The first portion 385-1 and the second portion 385-2 may be formed of the same material, and may be formed of a positive type of photosensitive organic material, for example, photosensitive polyimide (PSPI) may be used. Since it has a positive characteristic, the portion not covered by the mask may be removed upon irradiation. The spacer 385 has transparency so that light may be transmitted and/or reflected.

More than 90% of the upper surface of the black pixel defining layer 380 is covered by the spacer 385, and the edge of the second portion 385-2 has a structure that is spaced apart from the edge of the black pixel defining layer 380, so that the part of the black pixel defining layer 380 is not covered by the spacer 385.

The functional layer FL is positioned on the spacer 385 and the part of black pixel defining layer 380 that is not covered by the spacer 385, and the functional layer FL may be formed on the entire surface of the light emitting display device DP. The functional layer FL may include an electron injection layer, an electron transport layer, a hole transport layer, and a hole injection layer, and the functional layer FL may be positioned on/under the emission layer EML. That is, the hole injection layer, the hole transport layer, the emission layer EML, the electron transport layer, the electron injection layer, and the cathode (Cathode) are sequentially positioned on the anode (Anode) thereby the hole injection layer and the hole transport layer among the functional layer FL may be positioned under the emission layer EML, and the electron transport layer and the electron injection layer may be positioned on the emission layer EML.

The cathode (Cathode) may be formed of a light-transmitting electrode or a reflecting electrode. According to an embodiment, the cathode may be a transparent or semi-transparent electrode, and may be formed of a metal thin film having a small work function, including lithium (Li), calcium (Ca), lithium fluoride/calcium (LiF/Ca), lithium fluoride/aluminum (LiF/Al), aluminum (Al), silver (Ag), magnesium (Mg), and a compound thereof. In addition, a transparent conductive oxide (TCO) such as Iridium Tin Oxide (ITO), Indium Zinc Oxide (IZO), zinc oxide (ZnO), or indium oxide (In2O3) may be further disposed on the metal thin film. The cathode may be integrally formed over the entire surface of the light emitting display device DP.

An encapsulation layer 400 is positioned on the cathode (Cathode). The encapsulation layer 400 includes at least one inorganic layer and at least one organic layer, and in FIG. 5, it has a triple layer structure including the first inorganic encapsulation layer 401, the organic encapsulation layer 402, and the second inorganic encapsulation layer 403. The encapsulation layer 400 may be to protect the emission layer EML formed of an organic material from moisture or oxygen that may be inflowed from the outside. According to an embodiment, the encapsulation layer 400 may include a structure in which an inorganic layer and an organic layer are sequentially further stacked.

Detecting insulating layers 501, 510, and 511 and a plurality of detecting electrodes 540 and 541 are positioned on the encapsulation layer 400 for touch sensing. In an embodiment of FIG. 5, the touch is sensed in a capacitive type using two detecting electrodes 540 and 541, but according to an embodiment, the touch may be sensed in a self-cap type using one detecting electrode. A plurality of detecting electrodes 540, and 541 may be insulated with the detecting insulating layers 501, 510, and 511 interposed therebetween, and some of them may be electrically connected through openings positioned on the detecting insulating layers 501, 510, and 511. Here, the detecting electrodes 540 and 541 may include a metal or a metal alloy such as aluminum (Al), copper (Cu), silver (Ag), gold (Au), molybdenum (Mo), titanium (Ti), or tantalum (Ta), and may be composed of a single layer or multiple layers. In the present embodiment, the lower detecting insulating layer 501 is positioned under the lower detecting electrode 541, the middle detecting insulating layer 510 is positioned between the lower detecting electrode 541 and the upper detecting electrode 540, and the upper detecting insulating layer 511 is positioned between the upper detecting electrode 540 and the light blocking layer 220. The upper detecting insulating layer 511 may also be positioned under the color filters 230R, 230G, and 230B.

The light blocking layer 220 and the color filters 230R, 230G, and 230B are positioned on the upper detecting electrode 540.

The light blocking layer 220 may be positioned to overlap the detecting electrodes 540 and 541 on a plane. The light blocking layer 220 has an opening OPBM (hereafter also referred to as a light blocking layer opening), and the opening OPBM of the light blocking layer 220 is aligned with the opening OP (hereafter referred to as a pixel definition layer opening) of the black pixel defining layer 380 such that one is above the other. In addition, the opening OPBM of the light blocking layer 220 may be formed wider than the opening OP of the black pixel defining layer 380, so the opening OP of the black pixel defining layer 380 may be smaller than the opening OPBM of the light blocking layer 220 in plan view. The anode (Anode) overlapping with the opening OP of the black pixel defining layer 380 (i.e., exposed by the opening OP of the black pixel defining layer 380) may also have a structure that is not covered by the light blocking layer 220 on a plane.

The color filters 230R, 230G, and 230B are positioned on the detecting insulating layers 501, 510, and 511 and the light blocking layer 220. The color filters 230R, 230G, and 230B include a red color filter 230R that transmits red light, a green color filter 230G that transmits green light, and a blue color filter 230B that transmits blue light. In the embodiment of FIG. 5, the red color filter 230R further includes an overlapping part 230R-1 overlapping the light blocking layer 220 in addition to the main part position in the opening OPBM of the light blocking layer 220. The overlapping part 230R-1 of the red color filter 230R may be positioned on all the light blocking layers 220. The overlapping part 230R-1 may have a structure that connects adjacent main parts to each other. According to an embodiment, the overlapping part may be formed of the green color filter 230G and the blue color filter 230B.

Each of the color filters 230R, 230G, and 230B may be positioned to overlap the anode (Anode) of the light emitting diode (LED) on a plane. Since light from the emission layer EML may be emitted while being changed to a corresponding color through the color filter, all of the light emitted from the emission layer EL may have the same color. However, in the emission layer EML, different colors of light are displayed, and the displayed color may be enhanced by passing through the color filter of the same color.

The light blocking layer 220 may be positioned between the color filters 230R, 230G, and 230B. According to an embodiment, the color filters 230R, 230G, and 230B may be replaced with a color conversion layer, or may further include a color conversion layer. The color conversion layer may include quantum dots.

A planarization layer 550 covering the color filters 230R, 230G, and 230B is positioned on the color filters 230R, 230G, and 230B. The planarization layer 550 is for planarizing the upper surface of the light emitting display panel, and may be a transparent organic insulator containing at least one material selected from a group consisting of polyimide, polyamide, acryl resin, benzocyclobutene, and phenol resin.

According to the embodiment, on top of the planarization layer 550, a low refractive layer and an additional planarization layer may be further positioned to improve front visibility and light output efficiency of the display panel. Light may be emitted while being refracted to the front by the low refractive layer and the additional planarization layer having a high refractive characteristic.

In the present embodiment, there is no polarizer on the planarization layer 550. Usually, The polarizer may serve to prevent display deterioration recognizable by the user caused by external light being incident and reflected from the anode and the like. However, in the present embodiment, the black pixel defining layer 380 covers the side of the anode (Anode) to reduce the degree of the reflection from the anode (Anode), and the light blocking layer 220 is also formed to reduce the amount of incident light. Hence, a structure for preventing the deterioration of the display quality due to the reflection is already included and there is no need to separately form the polarizer on the front of the light emitting display device DP.

The light emitting display panel DP according to the embodiment may be largely divided into a lower panel layer and an upper panel layer. The lower panel layer is the part where the light emitting diode (LED) and the pixel circuit unit constituting the pixel are positioned, and can include up to the encapsulation layer 400 covering it. That is, the lower panel layer extends from the substrate 110 to the encapsulation layer 400 and includes the anode (Anode), the black pixel defining layer 380, the emission layer EML, the spacer 385, the functional layer FL, and the cathode (Cathode), and includes the insulating layer, the semiconductor layer, and the conductive layer between the substrate 110 and the anode (Anode).

On the other hand, the upper panel layer is a portion positioned on the encapsulation layer 400, and includes the detecting insulating layers 501, 510, and 511 and a plurality of detecting electrodes 540, and 541 capable of detecting the touch, and may include the light blocking layer 220, the color filters 230R, 230G, and 230B, and the planarization layer 550.

Hereinafter, the planar structure based on the upper panel layer is described with reference to FIG. 6.

FIG. 6 is a top plan view of a part of an upper panel layer of a light emitting display device according to an embodiment.

In FIG. 6, in addition to the planar structure of the light blocking layer 220 and the color filters 230R, 230G, and 230B included in the upper panel layer, the opening OP of the black pixel defining layer 380 positioned in the lower panel layer is also shown. According to FIG. 6, the light blocking layer 220 includes an opening OPBM. The opening OP of the black pixel defining layer 380 is aligned with the opening OPBM and has a smaller cross sectional area in the DR1-DR2 plane. As a result, in plan view, the opening OP of the black pixel defining layer 380 may be smaller than the opening OPBM and appear to be positioned "inside" the opening OPBM.

The color filters 230R, 230G, and 230B are positioned on the light blocking layer 220. One (the red color filter 230R in the embodiment of FIG. 6) of the color filters 230R, 230G, and 230B is disposed to blanket cover the encapsulation layer 400, then parts of it are removed to create the color filter openings OPCrg and OPCrb. The remaining two colors (the green and blue color filters 230G and 230B in the embodiment of FIG. 6) are disposed in the color filter openings OPCrg and OPCrb and/or the opening OPBM of the light blocking layer 220. In FIG. 6, color filter of each color is shown with a different hatching.

The red color filter 230R covers the light blocking layer 220 and includes an overlapping part 230R-1 overlapping the light blocking layer 220 on a plane and connecting the adjacent main parts in addition to the main part filling the opening OPBM for the red pixel among the opening OPBM of the light blocking layer 220. The overlapping part 230R-1 overlapping the light blocking layer 220 may be positioned on light blocking layers 220. Also, the overlapping part 230R-1 mayc over the detecting electrode 540 positioned under the light blocking layer 220.

In FIG. 6, around the main part of the red color filter 230R, the opening OPBM for the red pixel of the light blocking layer 220 and the opening OP of the black pixel defining layer 380 are positioned, and the opening OP of the black pixel defining layer 380 is positioned inside the opening OPBM for the red pixel of the light blocking layer 220.

On the other hand, the red color filter 230R includes the color filter openings OPCrg and OPCrb respectively corresponding to the positions corresponding to the opening OPBM for the green pixel and the opening OPBM for the blue pixel. The color filter openings OPCrg and OPCrb of the red color filter 230R are formed wider than the opening OPBM of the light blocking layer 220 so that the opening OPBM of the light blocking layer 220 may be positioned inside the color filter openings OPCrg and OPCrb in a plan view.

The color filter openings OPCrg and OPCrb, the opening OPBM of the light blocking layer 220, and the opening OP of the black pixel defining layer 380 are positioned at the portion where the green color filter 230G and the blue color filter 230B are to be formed. The opening OP of the black pixel defining layer 380 is positioned closest to the substrate 110, the opening OPBM of the light blocking layer 220 is farther from the substrate 110 than the opening OP, and the color filter openings OPCrg and OPCrb are positioned even farther out from the substrate 110 in the third direction DR3. The green and blue color filters 230G and 230B have a structure that covers all of these openings, so that the edges of the green and blue color filters 230G and 230B are positioned outside the boundary of the color filter openings OPCrg and OPCrb. Therefore, the color filter openings OPCrg and OPCrb are positioned on the inside of the green and blue color filters 230G and 230B, the opening OPBM of the light blocking layer 220 is positioned on the inside of the color filter openings OPCrg and OPCrb, and the opening OP of the black pixel defining layer 380 is positioned inside of the opening OPBM in the plan view of FIG. 6.

The green color filter 230G is formed at the position overlapping the opening OPBM for the green pixel of the light blocking layer 220 and the color filter opening OPCrg of the red color filter 230R for the green pixel. The green color filter 230G is formed in the opening OPBM for the green pixel and the color filter opening OPCrg for the green pixel and may be formed larger than the opening OPBM.

The blue color filter 230B is formed in the positions overlapping the opening OPBM for the blue pixel of the light blocking layer 220 and the color filter opening OPCrb of the red color filter 230R for the blue pixel. The blue color filter 230B is formed in the opening OPBM for the blue pixel and the color filter opening OPCrb for the blue pixel and may be formed larger than the opening OPBM.

Referring to FIG. 6, the position of the first portion 385-1 among the spacer 385 is also shown, and it may be formed at the position overlapping the light blocking layer 220 and the overlapping part 230R-1 of the red color filter 230R. However, the first portion 385-1 of the spacer 385 is formed on the black pixel defining layer 380 based on the third direction DR3, but is formed below the light blocking layer 220 or the overlapping part 230R-1 of the red color filter 230R based on the third direction DR3.

The green color filter 230G, the blue color filter 230B, the color filter openings OPCrg and OPCrb, the opening OPBM of the light blocking layer 220, and the opening OP of the black pixel defining layer 380 may have the same planar shape as each other or may have a chamfered shape. That is, in addition to a circle, a triangle, a quadrangle, and a polygon, they may have a shape of which polygon edges are chamfered. An example of the embodiment in which such a shape has been changed is described with reference to FIG. 7, FIG. 11 to FIG. 15, and FIG. 17.

Hereinafter, the planar and cross-section structures of the light blocking layer 220 and the color filters 230R, 230G, and 230B according to an embodiment and the manufacturing method thereof will be reviewed with reference to FIG. 7 to FIG. 9.

First, the planar and cross-section structures are described with reference to FIG. 7 and FIG. 8.

Figure 7:
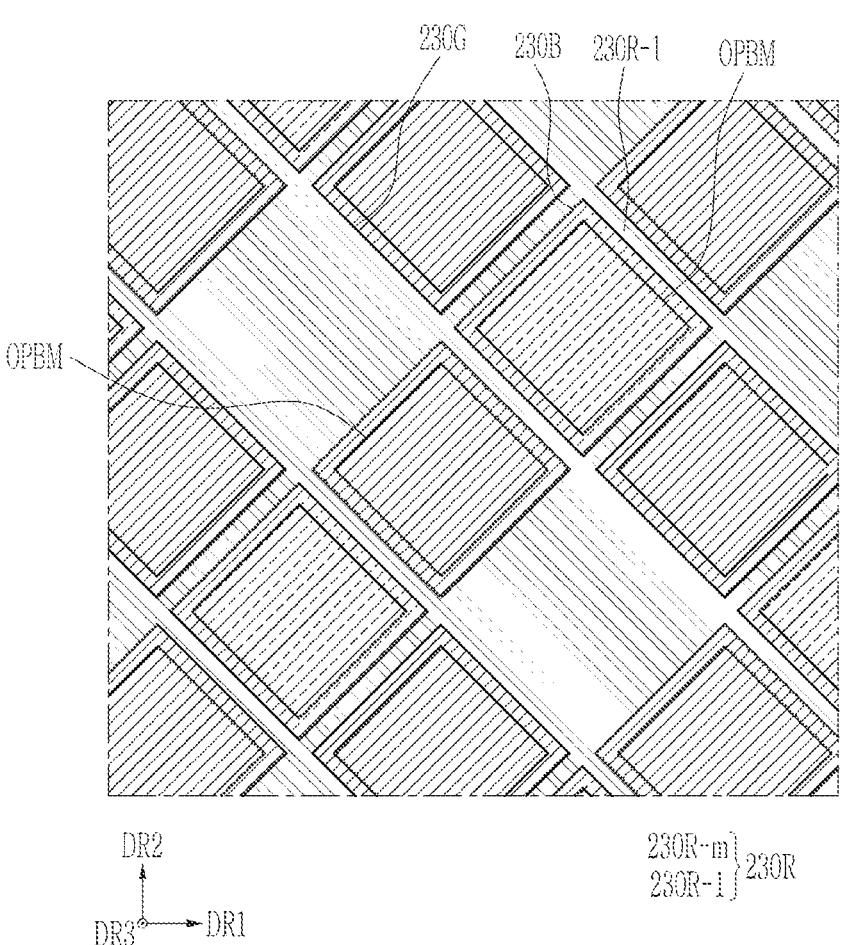
FIG. 7 is a top plan view schematically depicting a structure of a color filter according to an embodiment.

FIG. 7 is a top plan view schematically showing a structure of a color filter according to an embodiment, and FIG. 8 is a schematic cross-sectional view of a part of a light emitting display device according to an embodiment of FIG. 7.

In the planar structure of FIG. 7, the color filters 230R, 230G, and 230B are only shown and other parts are omitted. Also, in the planar structure of FIG. 7, unlike FIG. 6, color filter openings OPCrg and OPCrb of the color filter having a rhombus shape and the color filter are shown. At this time, the opening OPBM positioned on the light blocking layer 220 and the opening OP of the black pixel defining layer 380 may also have shapes corresponding to the color filter openings OPCrg and OPCrb of the color filter. The shape of the opening and the shape of the color filter may have various planar shapes such as a circle, a quadrangle, and a polygon, and may have a shape with chamfered edges.

Referring to FIG. 7, the red color filter 230R covers substantially the entire surface of the encapsulation layer 400 except for the color filter openings OPCrg and OPCrb at the positions corresponding to the opening OPBM for the green pixel and the opening OPBM for the blue pixel. As used herein, the part of the red color filter 230R that is in the opening OPBM for the red pixel of the light blocking layer 220 is referred to as the main part 230R-m and the rest of the red color filter 230R that do not cover any of the openings OPBMs is called an overlapping part 230R-1. The overlapping part 230R-1 connects the adjacent main parts 230R-m to each other. The overlapping part 230R-1 may be positioned on any light blocking layer 220.

The green color filter 230G is formed in the color filter opening OPCrg and the adjacently-located opening OPBM for the green pixel of the light blocking layer 220. In some embodiments, the green color filter 230G is formed only in the color filter opening OPCrg for the green pixel and the adjacent opening OPBM, and nowhere else. The green color filter 230G is formed in the opening OPBM for the green pixel and the color filter opening OPCrg for the green pixel and is formed such that the color filter opening OPCrg may be smaller than the green color filter 230G in plan view.

The blue color filter 230B is formed in the color filter opening OPCrb for the blue pixel and the adjacently-located opening OPBM for the blue pixel of the light blocking layer 220. In some embodiments, the blue color filter 230B is formed only in the color filter opening OPCrb and the adjacent opening OPBM for the blue pixel and nowhere else. The blue color filter 230B is formed in the opening OPBM for the blue pixel and the color filter opening OPCrb for the blue pixel and is formed such that the color filter opening OPCrb may be smaller than the blue color filter 230B in plan view.

The openings OPBM of the light blocking layer 220 and the color filter openings OPCrb and OPCrg may overlap each other in a plan view and one of them may be disposed inside of the other of them in plan view. In an embodiment, the openings OPBM of the light blocking layer 220 may disposed inside of the color filter openings OPCrb and OPCrg in plan view.

The cross-section structure of the color filters 230R, 230G, and 230B is described through FIG. 8.

As shown in FIG. 8, the detecting electrode 540 is positioned on the encapsulation layer 400 for touch sensing. In FIG. 8, the encapsulation layer 400 is illustrated as one layer, but in some embodiments, it may be formed as a plurality of layers including an inorganic layer and an organic layer. Also, the detecting electrode 540 may include six or more insulated electrodes.

The detecting electrode 540 is covered by the light blocking layer 220. The opening OPBM is positioned between the light blocking layers 220. Each of the color filters 230R, 230G, and 230B is positioned in the opening OPBM in the layer of light blocking layer 220. In addition, the color filters 230R, 230G, and 230B of each color may be partially positioned on the light blocking layer 220, but the overlapping part 230R-1 of the red color filter 230R formed as a whole may be positioned on all the light blocking layers 220.

Hereafter, the manufacturing method of the color filter according to an embodiment is described with reference to FIG. 9.

Figure 9:
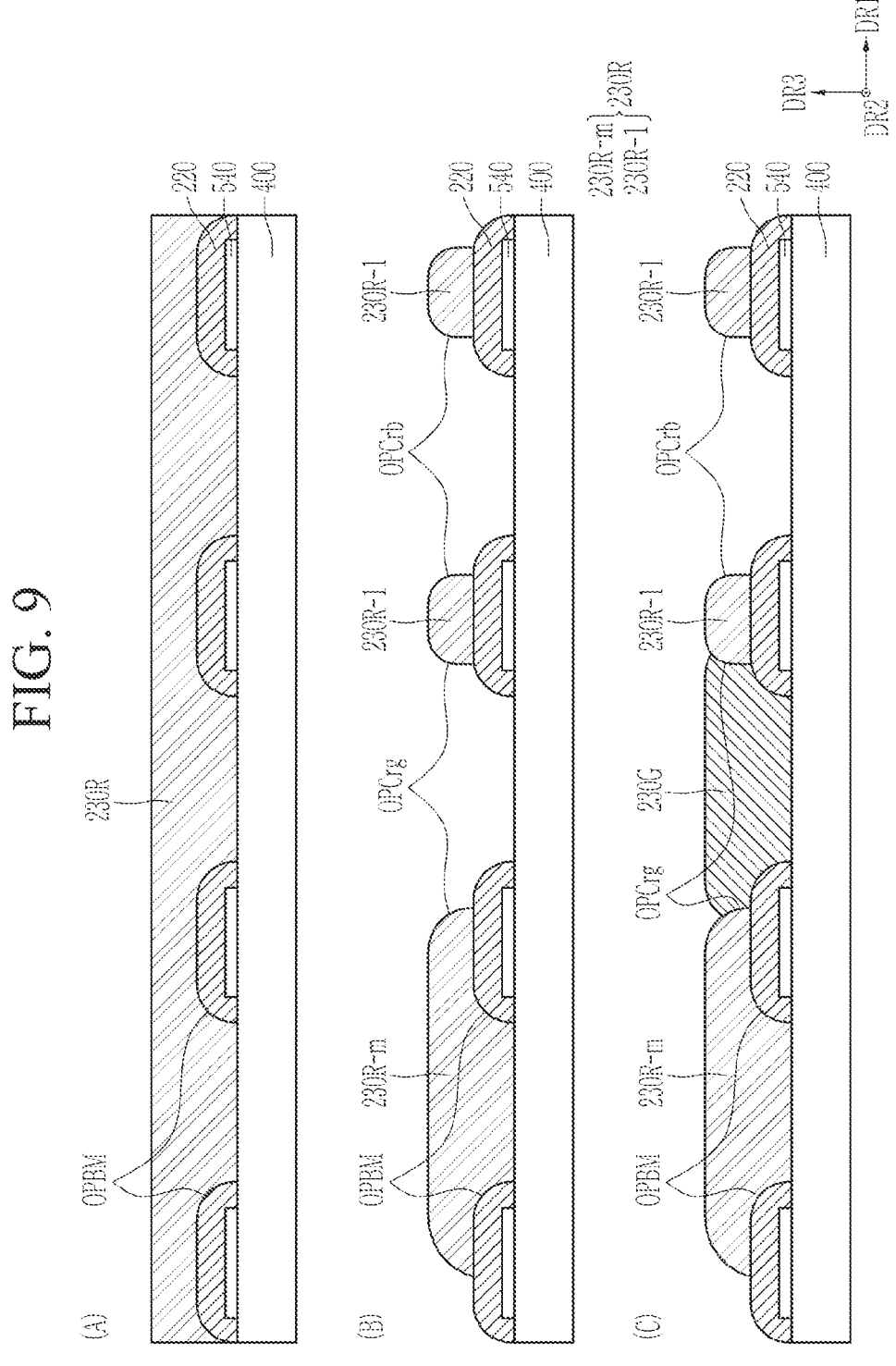
FIG. 9 is a view sequentially showing a manufacturing method of a color filter according to an embodiment of FIG. 8.

FIG. 9 is a view sequentially showing a manufacturing method of a color filter according to an embodiment of FIG. 8.

The partial manufacturing method including the color filter among the manufacturing method of the display device according to an embodiment may include forming a light blocking layer including a first opening, a second opening, and a third opening on an encapsulation layer, forming a first color filter respectively having a color filter opening overlapping the second opening and the third opening on a plane by using a mask after stacking an organic material for the first color filter on an entire area, completing a second color filter by forming an organic material for the second color filter by an inkjet method on a part overlapping the second opening on a plane, and completing a third color filter by forming an organic material for the third color filter by an inkjet method on a part overlapping the third opening on a plane.

Figure 10:
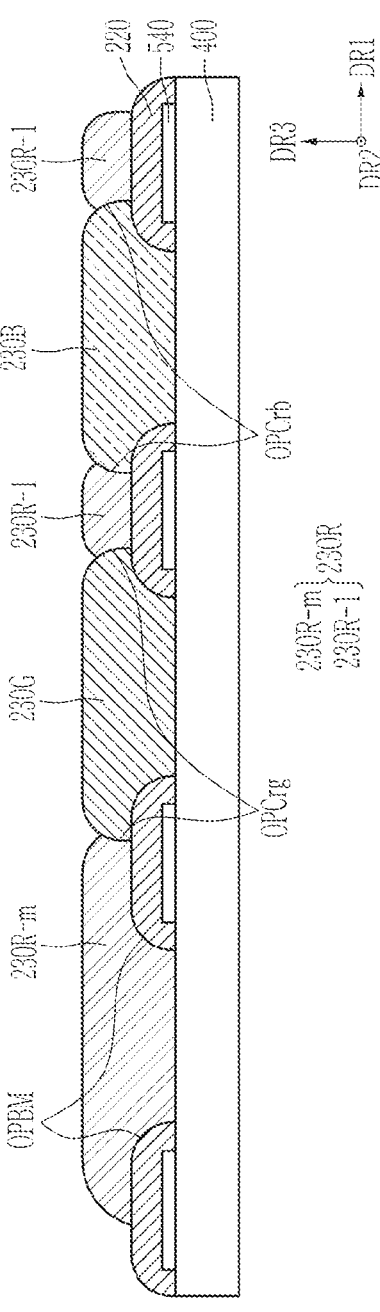
FIG. 10 is a schematic cross-sectional view depicting a variation structure of an embodiment of FIG. 8.

Each step is described based on FIG. 9 with reference to FIG. 8 and FIG. 10.

In FIG. 9(A), after forming the detecting electrode 540 and the light blocking layer 220 on the encapsulation layer 400, the organic material for the red color filter 230R is disposed thereon. As shown in FIG. 9(A), the organic material for the red color filter 230R may be blanket deposited on the entire surface of the encapsulation layer 400 to cover the light blocking layers 220 on the encapsulation layer 400 and exposed parts of the encapsulation layer 400. An opening OPBM is formed in the layer of light blocking layer 220 by removing parts of the layer. The opening OPBM is formed for each color filter of each color.

Next, as shown in FIG. 9(B), the organic material for the red color filter 230R is irradiated and developed with a mask to form a structure including color filter openings OPCrg and OPCrb. In this case, as the structure of the red color filter 230R is completed, the red color filter 230R has a main part 230R-m filling the opening OPBM for the red pixel of the light blocking layer 220 and an overlapping part 230R-1 covering the rest of the surface including the light blocking layer 220 and connecting the adjacent main parts 230R-m. Openings OPCrg and OPCrb are formed in the red color filter 230R, and these are intended for green and blue color filters, respectively.

Next, as shown in FIG. 9(C), the organic material for the green color filter 230G is formed by an inkjet method on the color filter opening OPCrg of the red color filter 230R for the green pixel to complete the green color filter 230G.

Next, as shown in FIG. 8, the organic material for the blue color filter 230B is formed in the color filter opening OPCrb for the blue pixel that is formed in the layer of red color filter 230R. The material for the blue color filter 230B is disposed by an inkjet method to complete the blue color filter 230B, thereby also forming the entire structure of the final color filter layer.

According to this manufacturing method, when forming the green color filter 230G and the blue color filter 230B, there is no need to perform the exposure and development process because an additional mask is not used, and since it may be formed by simply spraying in the inkjet method, there is a merit of shortening the manufacturing process time and reducing the cost.

Figure 19:
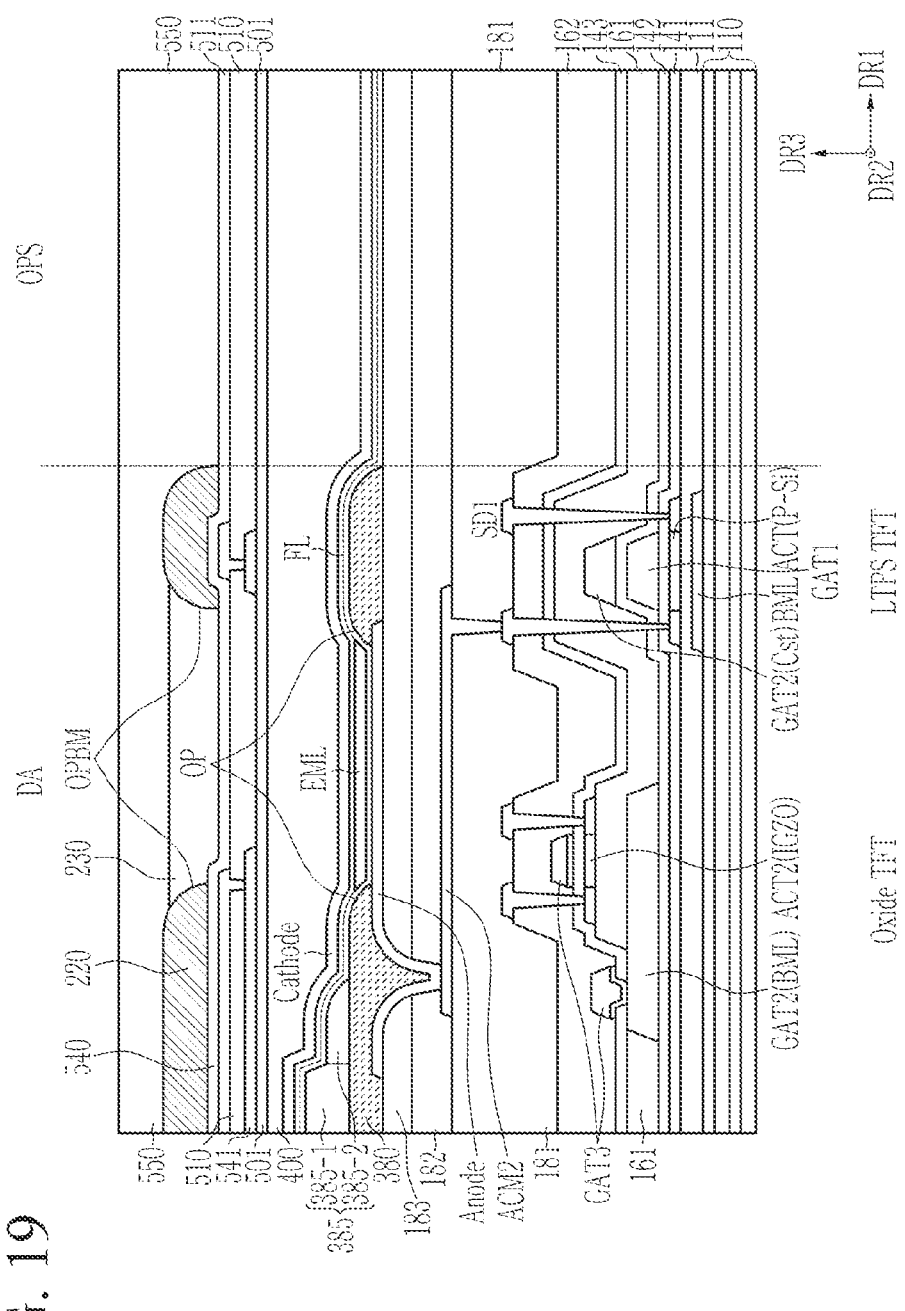
FIG. 19 is a cross-sectional view of a light emitting display device according to an embodiment.

Particularly, the light emitting display device with the layered structure like FIG. 19 has a lot of the layer structure, so the number of masks used is large, and by using only one mask instead of using three masks to form the color filter, the manufacturing process time and cost may be reduced.

On the other hand, according to an embodiment, the part of the color filter layer having the overlapping part 230R-1 may be formed after the color filters of the other two colors, resulting in the structure described with reference to FIG. 10.

FIG. 10 is a schematic cross-sectional view showing a variation structure of an embodiment of FIG. 8.

FIG. 10 shows an embodiment in which the red color filter 230R has the overlapping part 230R-1 formed after the color filters 230G and 230B of two different colors.

The structure of FIG. 10 unlike FIG. 8 shows a structural difference in which the color filters 230G and 230B of the other two colors are positioned lower than the red color filter 230R on the light blocking layer 220 and are formed wider.

The method for manufacturing the structure of FIG. 10 is described as follows.

After forming the detecting electrode 540 and the light blocking layer 220 on the encapsulation layer 400, the organic material for the green color filter 230G is formed in the opening OPBM for the green pixel of the light blocking layer 220 by an inkjet method, and the organic material for the blue color filter 230B is formed in the opening OPBM for the blue pixel by an inkjet method.

After forming the organic material for the red color filter 230R on the encapsulation layer 400, a mask is placed over the organic material and developed to form the color filter openings OPCrg and OPCrb.

According to this process, the cross-section structure of FIG. 10 may be completed.

Next, an embodiment in which the color filter of the different color has the overlapping part is described with reference to FIG. 11 and FIG. 12.

Figure 11:
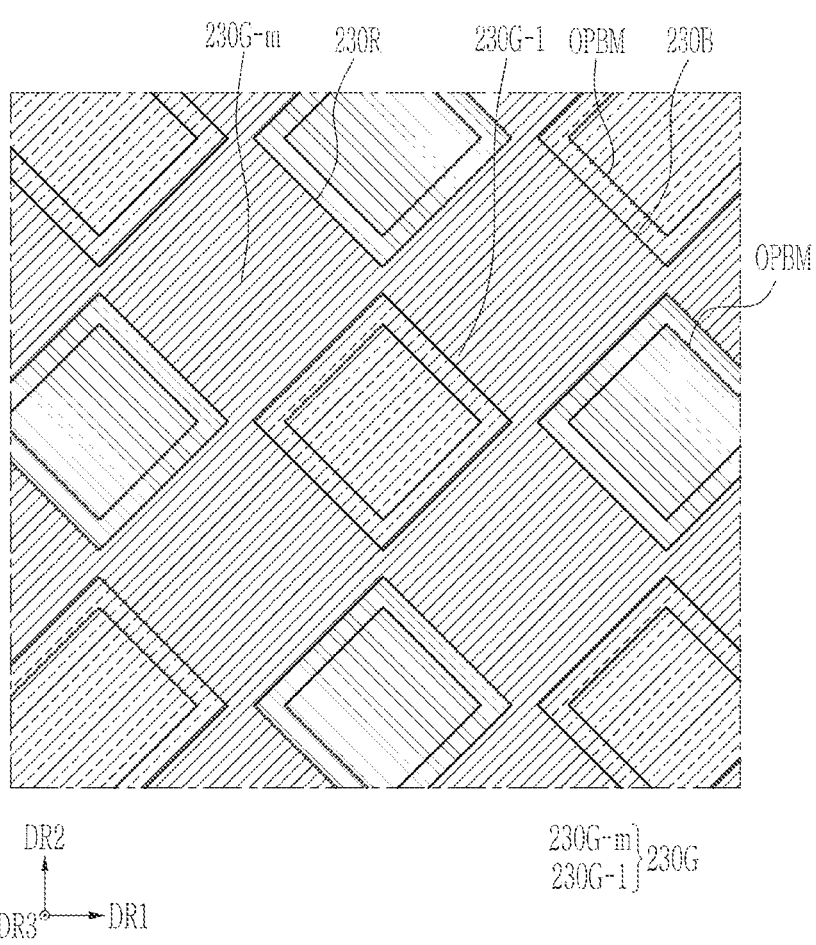
FIG. 11 and FIG. 12 are top plan views depicting a variation structure of an embodiment of FIG. 7.
Figure 12:
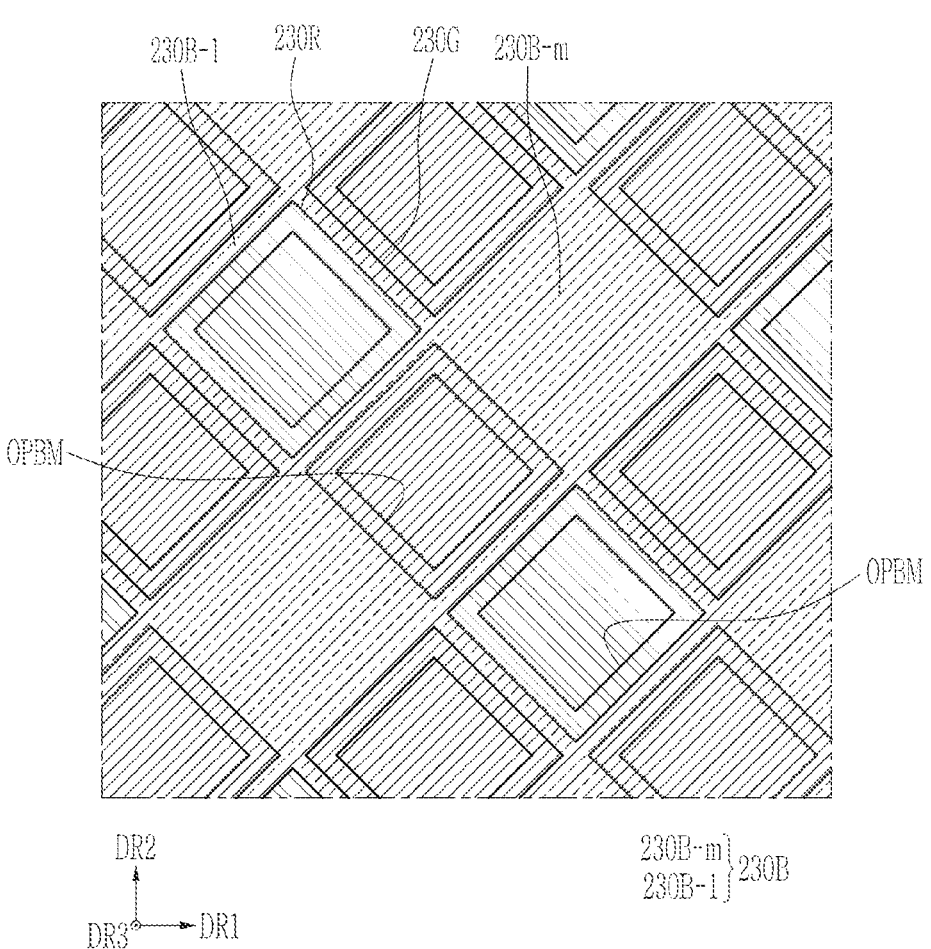

FIG. 11 and FIG. 12 are top plan views showing a variation structure of an embodiment of FIG. 7.

First, an embodiment in which the green color filter 230G has the overlapping part 230G-1 is described with reference to FIG. 11. This embodiment differs from the above embodiments where the red color filter 230R has the overlapping part 230R-1.

Referring to FIG. 11, the green color filter 230G has color filter openings OPCgr and OPCgb respectively positioned at the positions corresponding to the opening OPBM for the red pixel and the opening OPBM for the blue pixel and covers other parts of the encapsulation layer 400. Among them, it has a main part 230G-m filling the opening OPBM for the green pixel of the light blocking layer 220 and an overlapping part 230G-1 covering at least part of the light blocking layer 220. The overlapping part 230G-1 connects the green color filter 230G parts positioned in the openings OPBM for the adjacent green pixels to each other. The overlapping part 230G-1 may be positioned on any light blocking layer 220.

The red color filter 230R is formed in the position including the color filter opening OPCgr for the red pixel in the green color filter 230G. In some embodiments, the red color filter 230R is formed only in the position including the color filter opening OPCgr for the red pixel in the green color filter 230G. The blue color filter 230B is formed in the position including the color filter opening OPCgb for the blue pixel in the green color filter 230G. In some embodiments, the blue color filter 230B is formed only in the position including the color filter opening OPCgb for the blue pixel in the green color filter 230G.

An embodiment in which the blue color filter 230B has the overlapping part 230B-1 is described with reference to FIG. 12.

Referring to FIG. 12, the blue color filter 230B has color filter openings OPCbr and OPCbg at positions corresponding to the opening OPBM for the red pixel and the opening OPBM for the green pixel, and has overlapping part 230B-1 formed 0n other parts of the encapsulation layer 400. Among them, it has a main part 230B-m filling and covering the opening OPBM for the blue pixel of the light blocking layer 220 and an overlapping part 230B-1 overlapping the light blocking layer 220. The overlapping part 230B-1 connects the adjacent blue color filter 230B parts positioned within the opening OPBM for the blue pixel to each other. The overlapping part 230B-1 may be positioned on any light blocking layer 220.

At this time, the red color filter 230R is formed in the color filter opening OPCbr for the red pixel of the blue color filter 230B, and the green color filter 230G is formed in the color filter opening OPCbg for the green pixel of the blue color filter 230B.

Hereinafter, a modified embodiment is described through FIG. 13 to FIG. 15, and in the embodiment shown in FIG. 13 to FIG. 15, an embodiment with the chamfered edges is shown.

Figure 13:
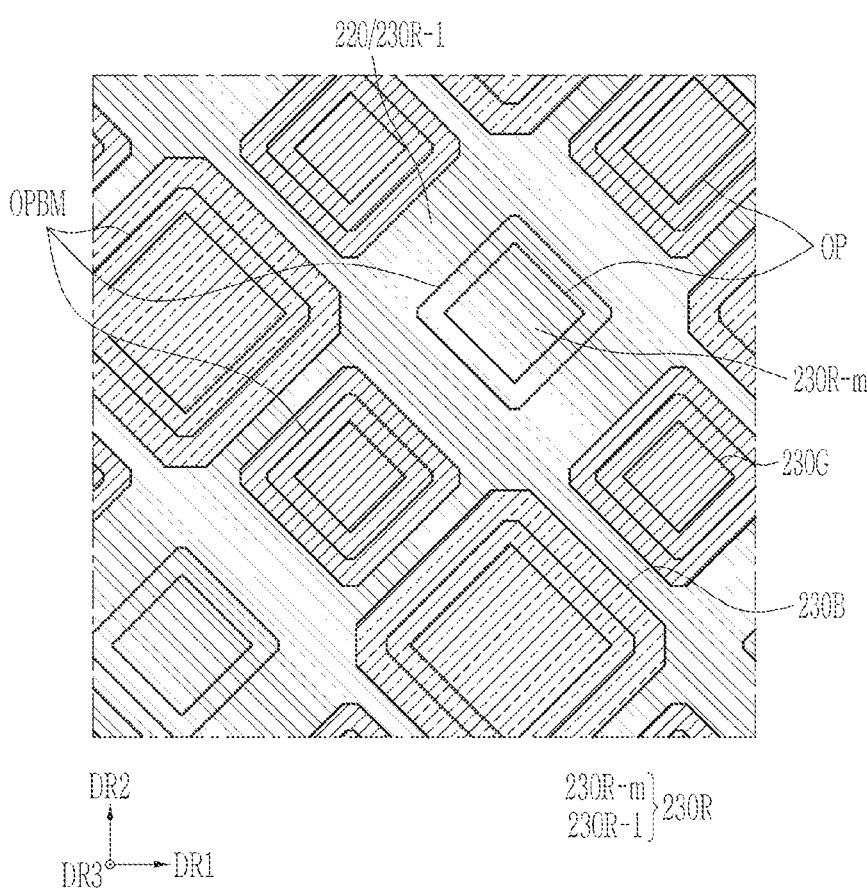
FIG. 13, FIG. 14, and FIG. 15 are top plan views schematically depicting a structure of a color filter, a light blocking layer, and a pixel definition layer according to an embodiment.
Figure 14:
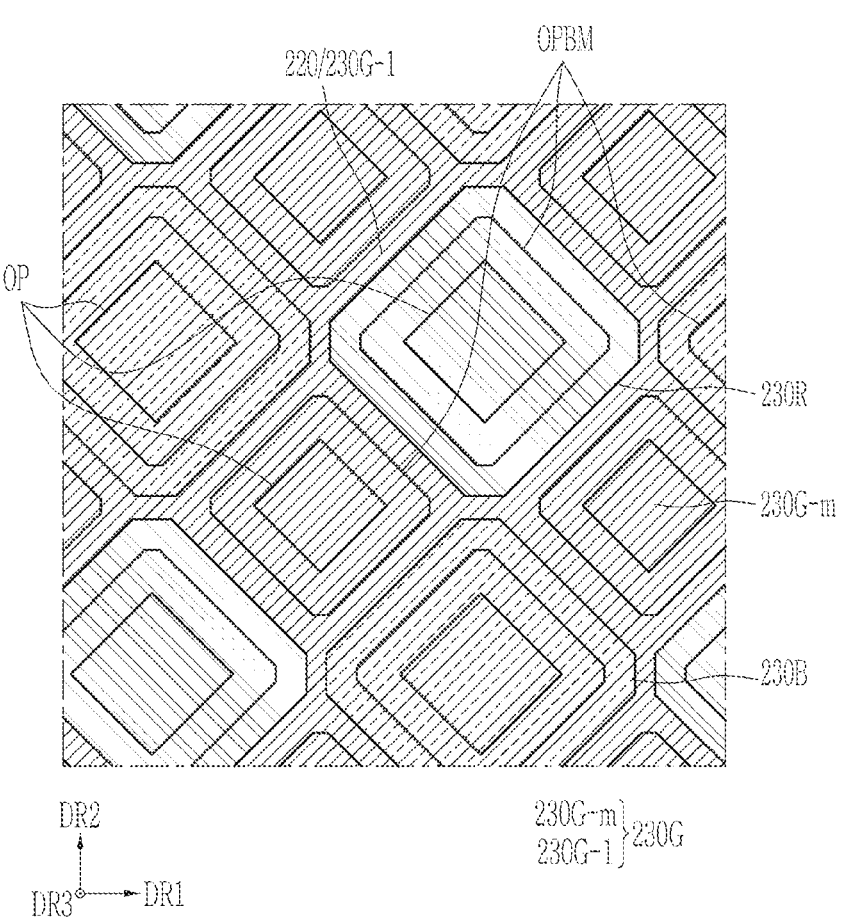
Figure 15:
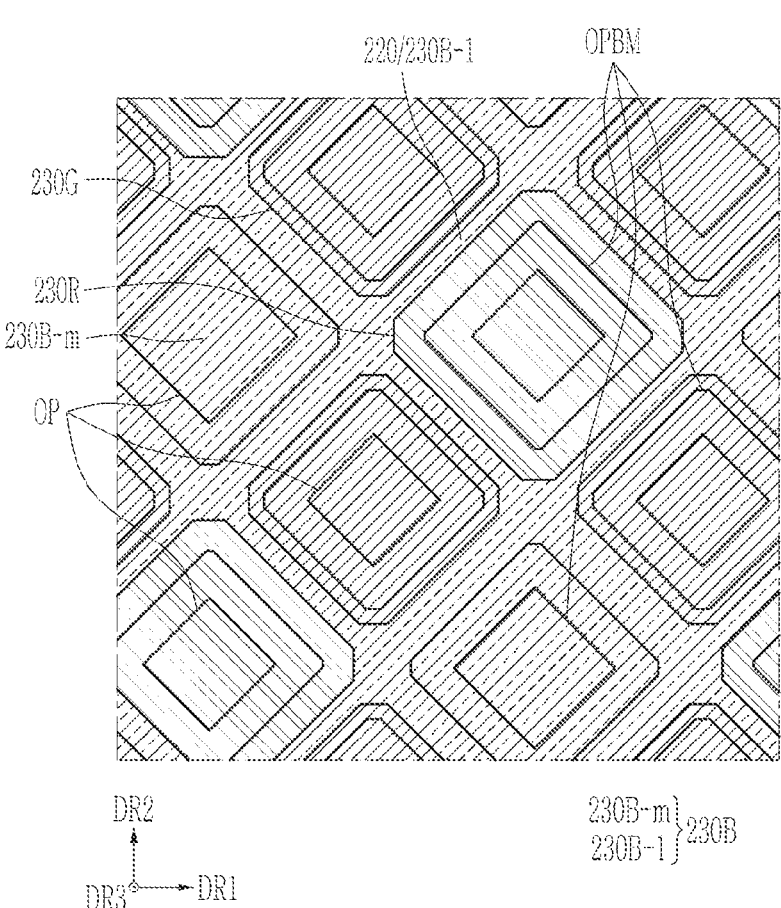

FIG. 13 to FIG. 15 are top plan views schematically showing a structure of a color filter, a light blocking layer, and a pixel definition layer according to an embodiment.

FIG. 13 to FIG. 15 show variations of the structures depicted in FIG. 7, FIG. 11, and FIG. 12. In FIG. 13 to FIG. 15, the corner part of the rhombus structure has a chamfered structure and an opening OP of the black pixel defining layer 380 is additionally shown.

FIG. 13 shows an embodiment in which the red color filter 230R has the overlapping part 230R-1.

Although the opening of the color filter 230R is not shown in FIG. 13, it is formed in a position corresponding to the opening OPBM of the light blocking layer 220. Also, in FIG. 13, it may be confirmed that the opening OP of the black pixel defining layer 380 is also shown, is small compared to the opening OPBM of the light blocking layer 220, and is formed inside the opening OPBM of the light blocking layer 220 in plan view.

The red color filter 230R has the structure in which the overlapping part 230R-1 overlaps the light blocking layer 220 and connects the main part 230R-m of the red color filter 230R that is formed while filling the opening OPBM of the light blocking layer 220. The overlapping part 230R-1 may be positioned on the entire light blocking layer 220.

On the other hand, FIG. 14 and FIG. 15, differently from FIG. 13, show an embodiment in which the green color filter 230G has the overlapping part 230G-1 and an embodiment in which the blue color filter 230B has the overlapping part 230B-1.

In the above, the structures of the light blocking layer 220 and the color filters 230R, 230G, and 230B formed in the general display area of the light emitting display panel DP were examined.

Hereinafter, a structure in a case having an area (a light transmitting area or a photosensor area OPS) positioned at a partial area among the display area and capable of transmitting a light is described.

Hereinafter, the structure of the light blocking layer 220 and color filter 230R, 230G, and 230B is described with reference to FIG. 16 in an embodiment in which the light emitting display panel DP has the first element area DA2 including the light transmitting area and the photosensor area OPS (hereinafter also referred to as an optical sensor area) positioned therearound.

Figure 16:
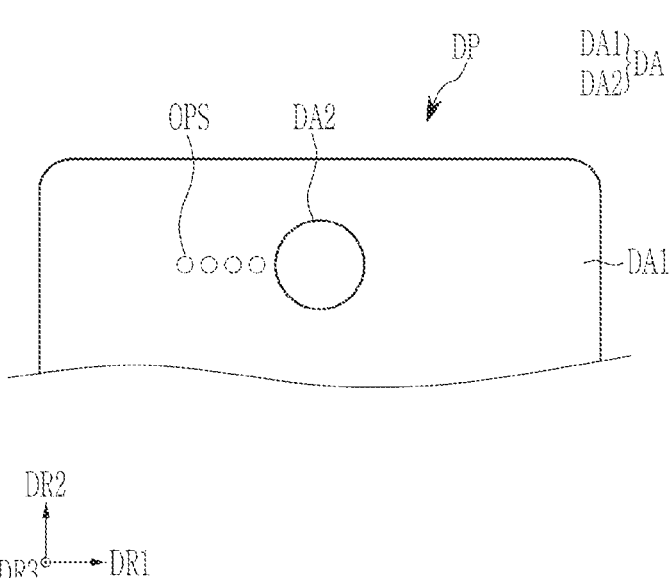
FIG. 16 is an enlarged top plan view of a partial area of a light emitting display device according to an embodiment.

FIG. 16 is an enlarged top plan view of some areas of a light emitting display device according to an embodiment.

FIG. 16 shows the part of the light emitting display panel DP among the light emitting display device according to an embodiment and uses a display panel for a mobile phone.

The light emitting display panel DP is disposed on the entire surface of the display area DA, and the display area DA is largely divided into a first display area DA1 (hereafter referred to as a main display area) and a first element area DA2 (hereafter referred to as a component area). A pixel including a light emitting diode (LED) may be positioned in the first display area DA1, and a light transmitting area other than the pixel including the light emitting diode (LED) may be positioned in the first element area DA2. In the embodiment of FIG. 16, a plurality of photosensor areas OPS are positioned in the first display area DA1 of the position adjacent to the first element area DA2. In the embodiment of FIG. 16, the photosensor area OPS is positioned to the left of the first element area DA2. Referring to FIG. 16, the display area DA further include a second element area OPS disposed near the first element area DA2. In FIG. 16, the corresponding optical element for the first element area DA2 may be a camera, and the corresponding optical element for the second element area OPS may be an optical sensor. The second element area OPS may be made only by light transmitting parts, and may not display an image. In an embodiment, the second element area OPS and a pixel disposed adjacent to the second element area OPS may be called together as a third display area. The position and number of the photosensor areas OPS may vary for each embodiment.

The first display area DA1 includes a plurality of light emitting diodes (LED), and a plurality of pixel circuit units generating a light emitting current to be transmitted to a plurality of light emitting diodes (LED). Here, one light emitting diode (LED) and one pixel circuit unit are referred to as a pixel PX. In the first display area DA1, one pixel circuit unit and one light emitting diode (LED) are formed one-to-one.

In FIG. 16, the structure of the light emitting display panel DP below the cutting line is not shown, but the first display area DA1 may be positioned under the cutting line. In the first display area DA1, except for the area where the photosensor area OPS is positioned, the structure of the upper panel layer may be the same as that of one embodiment described above.

The photosensor area OPS consists of only a transparent layer to allow light to pass through, and there is no conductive layer or semiconductor layer positioned, and an opening (hereinafter also referred to as an additional opening) may be formed at the position corresponding to the photosensor area OPS in the black pixel defining layer 380, the light blocking layer 220, and the color filter 230 to have a structure that does not block light. On the other hand, the structure of the upper panel layer in the photosensor area OPS of the first display area DA1 is described in FIG. 17.

On the other hand, the first element area DA2 is a display area positioned on the front surface of an optical element such as a camera, and has a structure in which a plurality of pixels are formed and a light transmitting area is additionally formed between the adjacent pixels.

Although not shown in FIG. 16, a peripheral area may be positioned outside the display area DA. FIG. 16 shows a display panel for a mobile phone. However, even for embodiments other than a mobile phone, if it is a display panel where there is an optical element on the back of the display panel, the present embodiment may be applied, and it may also be a flexible display device. In the case of the flexible display device, the position of the first element area DA2 and the photosensor area OPS may be different from the position of FIG. 16.

On the other hand, according to the embodiment, it may be a foldable light emitting display device such as in FIG. 4. In the case, the position of the photosensor area OPS may be positioned adjacent to the first element area DA2 of FIG. 4.

Hereinafter, the structure of the upper panel layer in the photosensor area OPS among the first display area DA1 is described with reference to FIG. 17.

Figure 17:
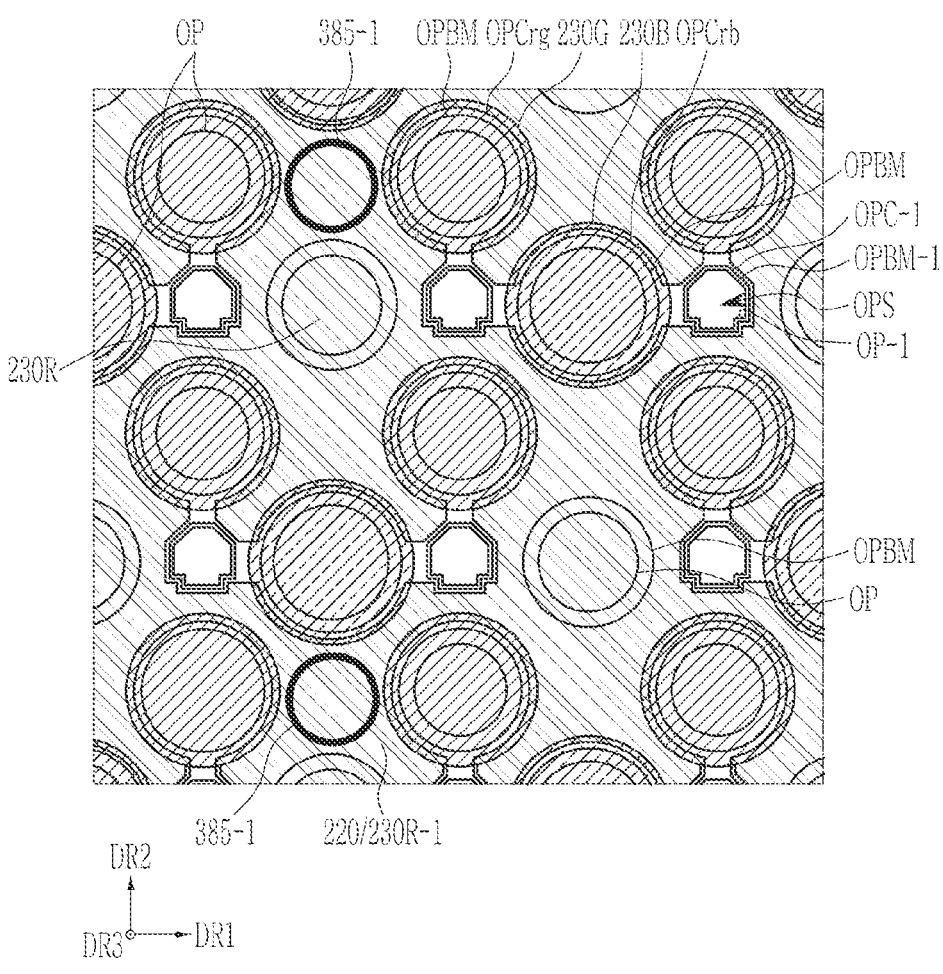
FIG. 17 is a top plan view of a part of an upper panel layer of a light emitting display device according to another embodiment.

FIG. 17 is a top plan view of a part of an upper panel layer of a light emitting display device according to another embodiment.

In FIG. 17, compared with FIG. 6, an additional opening OPBM-1 is formed in the light blocking layer 220 by corresponding to the additional photosensor area OPS, and an additional opening OPC-1 (hereinafter referred to as an additional color filter opening) is also formed in the red color filter 230R. In addition, the black pixel defining layer 380 of the lower panel layer may also have an additional opening OP-1 and may have the same shape as the additional opening OPBM-1 of the light blocking layer 220.

The additional opening OPC-1 formed in the red color filter 230R is extended from the color filter opening OPCrg for the green pixel and the color filter opening OPCrb for the blue pixel and is integrally formed. That is, in the red color filter 230R, the color filter opening OPCrg for the green pixel, the color filter opening OPCrb for the blue pixel, and the additional opening OPC-1 are formed as one opening.

FIG. 17 shows an embodiment in which three color filter openings (the color filter opening OPCrg for two green pixels and the color filter opening OPCrb for one blue pixel) and the additional opening OPC-1 of two red color filters 230R are connected to each other and integrally formed. However, the number of the connected openings in the red color filter 230R may vary. In addition, according to an embodiment, each opening of the red color filter 230R may be formed separately.

As described above, in the photosensor area OPS, the additional opening OPBM-1 of the light blocking layer 220, the additional opening OPC-1 of the red color filter 230R, and the black pixel defining layer 380 do not have the structure for blocking light to the photosensor area OPS by the additional opening OP-1. Also, even in the lower panel layer, the conductive layer or the semiconductor layer is not positioned in the photosensor area OPS. As a result, even if the photosensor is positioned on the back side of the light emitting display device DP, the front side of the light emitting display panel DP may be sensed with light.

In an embodiment of FIG. 17, the additional opening OPC-1 of the red color filter 230R, the additional opening OPBM-1 of the light blocking layer 220, and the additional opening OP-1 of the black pixel defining layer 380 align with each in plan view with the additional opening OPC-1 of the red color filter 230R being the largest, the additional opening OPBM-1 of the light blocking layer 220 being the next largest, and the additional opening OP-1 of the black pixel defining layer 380 being the smallest. As a result, the additional opening OPBM-1 of the light blocking layer 220 may be positioned inside the additional opening OPC-1 of the red color filter 230R, and the additional opening OP-1 of the black pixel defining layer 380 may be positioned inside the additional opening OPBM-1 of the light blocking layer 220.

Also, the embodiment of FIG. 17 may have the same structure as the structure of FIG. 6 except for the photosensor area OPS.

That is, the red color filter 230R further includes an overlapping part 230R-1 overlapping the light blocking layer 220 on a plane and connecting the adjacent main parts in addition to the main part overlapping the light blocking layer 220 and filling the opening OPBM for the red pixel among the opening OPBM of the light blocking layer 220. The overlapping part 230R-1 overlapping with the light blocking layer 220 may be positioned on all the light blocking layers 220. Also, the overlapping part 230R-1 may cover the detecting electrode 540 positioned under the light blocking layer 220.

The opening OPBM for the red pixel of the light blocking layer 220 and the opening OP of the black pixel defining layer 380 are positioned around the main part 230R-m of the red color filter 230R, and the opening OP of the black pixel defining layer 380 is positioned inside the opening OPBM for the red pixel of the light blocking layer 220.

On the other hand, the red color filter 230R has the color filter openings OPCrg and OPCrb in the positions corresponding to the opening OPBM for the green pixel and the opening OPBM for the blue pixel, respectively. The color filter openings OPCrg and OPCrb of the red color filter 230R are formed wider than the opening OPBM of the light blocking layer 220, so that the opening OPBM of the light blocking layer 220 may be positioned on the inside of the color filter openings OPCrg and OPCrb on a plane.

In the part where the green color filter 230G and the blue color filter 230B are positioned, the color filter openings OPCrg and OPCrb, the opening OPBM of the light blocking layer 220, and the opening OP of the black pixel defining layer 380 are positioned, on a plane, the opening OP of the black pixel defining layer 380 is positioned on the innermost side, then the opening OPBM of the light blocking layer 220 is positioned on the inner side, and the color filter openings OPCrg and OPCrb are positioned on the outermost side. The green and blue color filters 230G and 230B have a structure that covers all of these openings, so that the edges of the green and blue color filters 230G and 230B are positioned outside the boundary of the color filter openings OPCrg and OPCrb. Therefore, in plan view, the color filter openings OPCrg and OPCrb may be positioned on the inside of the green and blue color filters 230G and 230B, the opening OPBM of the light blocking layer 220 may be positioned on the inside thereof, and the opening OP of the black pixel defining layer 380 may be inside thereof.

Referring to FIG. 17, the position of the first portion 385-1 of the spacer 385 is also shown and may be formed at the position overlapping the light blocking layer 220 and the overlapping part 230R-1 of the red color filter 230R on a plane, and may not overlap the photosensor area OPS. However, the first portion 385-1 of the spacer 385 is formed on the black pixel defining layer 380 in the third direction DR3, but is positioned under the light blocking layer 220 or the overlapping part 230R-1 of the red color filter 230R based on the third direction DR3.

Hereinafter, the structure of the pixel positioned in the lower panel layer of the light emitting display panel DP is described with reference to FIG. 18 and FIG. 19. The following pixel structure may be a pixel structure of the first display area DA1 and/or the first element area DA2 including the photosensor area OPS.

The circuit structure of the pixel is described with reference to FIG. 18.

Figure 18:
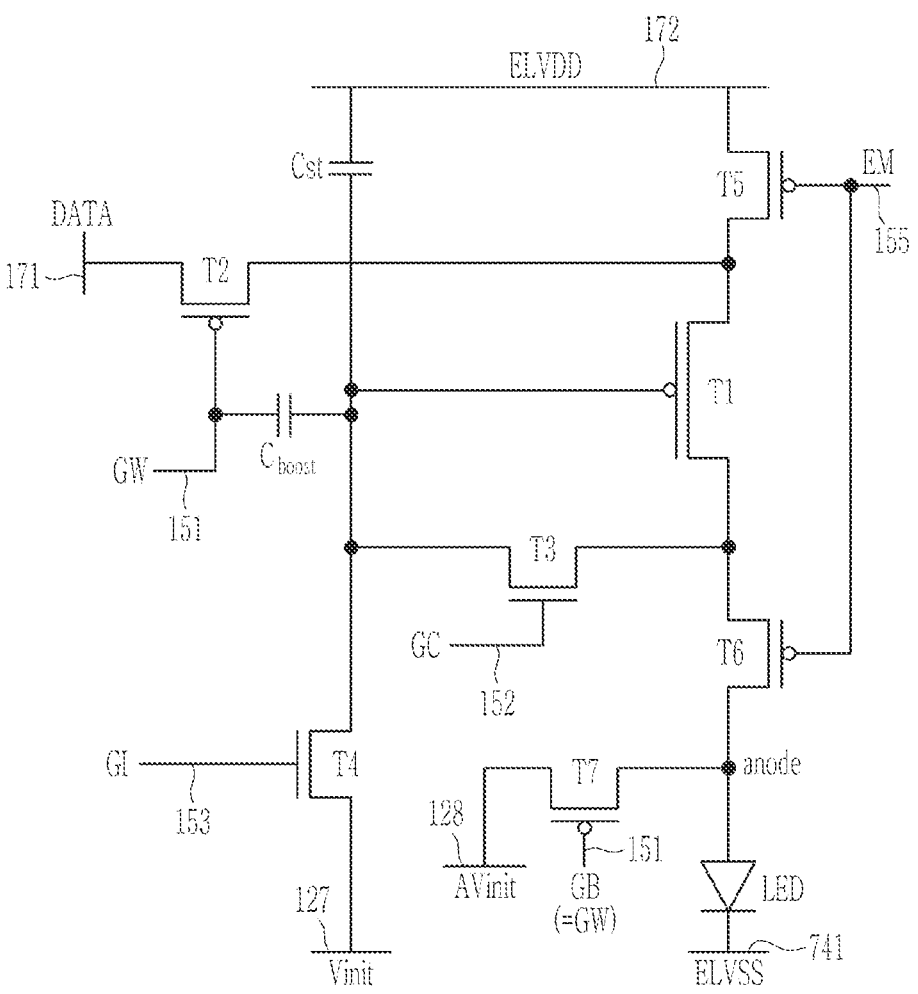
FIG. 18 is a circuit diagram of one pixel included in a light emitting display device according to an embodiment.

FIG. 18 is a circuit diagram of one pixel included in a light emitting display device according to an embodiment.

The circuit structure shown in FIG. 18 is a circuit structure of the pixel circuit unit and the light emitting diode (LED) formed in the first display area DA1 and the first element area DA2.

One pixel according to an embodiment incudes a plurality of transistors T1, T2, T3, T4, T5, T6, and T7, a storage capacitor Cst, a boost capacitor $C_{boost}$, and a light emitting diode (LED), which are connected to several wirings 127, 128, 151, 152, 153, 155, 171, 172, and 741. Here, the transistors and the capacitors except for the light emitting diode (LED) constitute the pixel circuit unit. According to an embodiment, the boost capacitor $C_{boost}$ may be omitted.

A plurality of wirings 127, 128, 151, 152, 153, 155, 171, 172, and 741 are connected to one pixel PX. A plurality of wirings includes a first initialization voltage line 127, a second initialization voltage line 128, a first scan line 151, a second scan line 152, an initialization control line 153, a light emitting control line 155, a data line 171, a driving voltage line 172, and a common voltage line 741. In the embodiment of FIG. 18, the first scan line 151 connected to the seventh transistor T7 is also connected to the second transistor T2, and according to an embodiment, the seventh transistor T7 may be connected by a separate bypass control line unlike the second transistor T2.

The first scan line 151 is connected to a scan driver (not shown) to transmit a first scan signal GW to a second transistor T2 and a seventh transistor T7. A voltage of an opposite polarity to the voltage applied to the first scan line 151 may be applied to the second scan line 152 at the same timing as the signal of the first scan line 151. For example, when a negative voltage is applied to the first scan line 151, a positive voltage may be applied to the second scan line 152. The second scan line 152 transmits a second scan signal GC to the third transistor T3. The initialization control line 153 transmits an initialization control signal GI to the fourth transistor T4. The light emission control line 155 transmits a light emission control signal EM to the fifth transistor T5 and the sixth transistor T6.

The data line 171 is a wire transmitting a data voltage DATA generated from a data driver (not shown), and a luminance emitted by the light emitting diode (LED) is changed depending on a change of the magnitude of the light emitting current transmitted to the light emitting diode LED. The driving voltage line 172 applies the driving voltage ELVDD. The first initialization voltage line 127 transmits the first initialization voltage Vinit, and the second initialization voltage line 128 transmits the second initialization voltage AVinit. The common voltage line 741 applies a common voltage ELVSS to the cathode of the light emitting diode LED. In the present exemplary embodiment, the voltages applied to the driving voltage line 172, the first and second initialization voltage lines 127 and 128, and the common voltage line 741 may be a constant voltage, respectively.

The driving transistor (T1: also called a first transistor) is a p-type transistor and has a silicon semiconductor as a semiconductor layer. It is a transistor that adjusts the magnitude of the light emitting current output to the anode of the light emitting diode LED according to the magnitude of the voltage (i.e., the voltage stored in the storage capacitor Cst) of the gate electrode of the driving transistor T1. Since the brightness of the light emitting diode LED is adjusted according to the magnitude of the light emitting current output to the anode of the light emitting diode LED, the light emitting luminance of the light emitting diode LED may be adjusted according to the data voltage DATA applied to the pixel. For this purpose, the first electrode of the driving transistor T1 is disposed to receive the driving voltage ELVDD and is connected to the driving voltage line 172 through the fifth transistor T5. Also, the first electrode of the driving transistor T1 is connected to the second electrode of the second transistor T2, thereby also receiving the data voltage DATA. Meanwhile, the second electrode of the driving transistor T1 outputs the light emitting current and is connected to the anode of the light emitting diode LED via the sixth transistor T6 (hereinafter referred to as an output control transistor). In addition, the second electrode of the driving transistor T1 is also connected to the third transistor T3, and the data voltage DATA applied to the first electrode is transferred to the third transistor T3. Meanwhile, the gate electrode of the driving transistor T1 is connected to one electrode (hereinafter referred to as 'a second storage electrode') of the storage capacitor Cst. The voltage of the gate electrode of the driving transistor T1 changes according to the voltage stored in the storage capacitor Cst, and accordingly, the light emitting current output by the driving transistor T1 is changed. The storage capacitor Cst serves to keep the voltage of the gate electrode of the driving transistor T1 constant for one frame. Meanwhile, the gate electrode of the driving transistor T1 may also be connected to the third transistor T3 so that the data voltage DATA applied to the first electrode of the driving transistor T1 may be transmitted to the gate electrode of the driving transistor T1 through the third transistor T3. Meanwhile, the gate electrode of the driving transistor T1 is also connected to the fourth transistor T4 and may be initialized by receiving the first initialization voltage Vinit.

The second transistor T2 is a p-type transistor and has a silicon semiconductor as a semiconductor layer. The second transistor T2 is a transistor that receives the data voltage DATA into the pixel. The gate electrode of the second transistor T2 is connected to the first scan line 151 and one electrode (hereinafter referred to as 'a lower boost electrode') of the boost capacitor $C_{boost}$. The first electrode of the second transistor T2 is connected to the data line 171. The second electrode of the second transistor T2 is connected to the first electrode of the driving transistor T1. When the second transistor T2 is turned on by the negative voltage of the first scan signal GW transmitted through the first scan line 151, the data voltage DATA transferred through the data line 171 is transmitted to the first electrode of the driving transistor T1, and finally the data voltage DATA is transmitted to the gate electrode of the driving transistor T1 and stored in the storage capacitor Cst.

The third transistor T3 is an n-type transistor and has an oxide semiconductor as a semiconductor layer. The third transistor T3 electrically connects the second electrode of the driving transistor T1 and the gate electrode of the driving transistor T1. As a result, it is a transistor that allows the data voltage DATA to be compensated by the threshold voltage of the driving transistor T1 and then stored in the second storage electrode of the storage capacitor Cst. The gate electrode of the third transistor T3 is connected to the second scan line 152, and the first electrode of the third transistor T3 is connected to the second electrode of the driving transistor T1. The second electrode of the third transistor T3 is connected to the second storage electrode of the storage capacitor Cst, the gate electrode of the driving transistor T1, and the other electrode (hereinafter referred to as 'an upper boost electrode') of the boost capacitor $C_{boost}$. The third transistor T3 is turned on by the positive voltage of the second scan signal GC transmitted through the second scan line 152 to connect the gate electrode of the driving transistor T1 and the second electrode of the driving transistor T1 and to transmit the voltage applied to the gate electrode of the driving transistor T1 to the second storage electrode of the storage capacitor Cst to be stored to the storage capacitor Cst. At this time, the voltage stored in the storage capacitor Cst is stored in a state in which the voltage of the gate electrode of the driving transistor T1 when the driving transistor T1 is turned off is stored, so that the threshold voltage Vth of the driving transistor T1 is compensated.

The fourth transistor T4 is an n-type transistor and has an oxide semiconductor as a semiconductor layer. The fourth transistor T4 initializes the gate electrode of the driving transistor T1 and the second storage electrode of the storage capacitor Cst. The gate electrode of the fourth transistor T4 is connected to the initialization control line 153, and the first electrode of the fourth transistor T4 is connected to the first initialization voltage line 127. The second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by the positive voltage of the initialization control signal GI received through the initialization control line 153, and in this case, the first initialization voltage Vinit is transmitted to the gate electrode of the driving transistor T1, the second storage electrode of the storage capacitor Cst, and the upper boost electrode of the boost capacitor $C_{boost}$ to be initialized.

The fifth transistor T5 and the sixth transistor T6 are p-type transistors, and have a silicon semiconductor as a semiconductor layer.

The fifth transistor T5 serves to transmit the driving voltage ELVDD to the driving transistor T1. The gate electrode of the fifth transistor T5 is connected to the light emitting control line 155, the first electrode of the fifth transistor T5 is connected to the driving voltage line 172, and the second electrode of the fifth transistor T5 is connected to the first electrode of the driving transistor T1.

The sixth transistor T6 serves to transmit the light emitting current output from the driving transistor T1 to the light emitting diode LED. The gate electrode of the sixth transistor T6 is connected to the light emitting control line 155, the first electrode of the sixth transistor T6 is connected to the second electrode of the driving transistor T1, and the second electrode of the sixth transistor T6 is connected to the anode of the light emitting diode LED.

The seventh transistor T7 is a p-type or n-type transistor, and the semiconductor layer has a silicon semiconductor or an oxide semiconductor. The seventh transistor T7 initializes the anode of the light emitting diode LED. The gate electrode of the seventh transistor T7 is connected to first scan line 151, the first electrode of the seventh transistor T7 is connected to the anode of the light emitting diode LED, and the second electrode of the seventh transistor T7 is connected to the second initialization voltage line 128. When the seventh transistor T7 is turned on by the negative voltage of the first scan line 151, the second initialization voltage AVinit is applied to the anode of the light emitting diode LED to be initialized. On the other hand, the gate electrode of the seventh transistor T7 may be connected to a separate bypass control line and may be controlled by the first scan line 151 and separate wiring. Also, according to an embodiment, the second initialization voltage line 128 to which the second initialization voltage AVinit is applied may be the same as the first initialization voltage line 127 to which the first initialization voltage Vinit is applied.

Although it has been described that one pixel PX includes seven transistors T1 to T7 and two capacitors (the storage capacitor Cst, the boost capacitor $C_{boost}$), the present invention is not limited thereto, and the boost capacitor $C_{boost}$ may be excluded according to an embodiment. Also, although the embodiment in which the third transistor and the fourth transistor are formed of the n-type transistor is described, only one of them may be formed as an n-type transistor or the other transistor may be formed as an n-type transistor.

In the above, the circuit structure of the pixel formed in the display area DA was described with reference to FIG. 18.

Hereinafter, the details of the planar structure of the pixels formed in the display area DA and the stacked structure of the photosensor area OPS are described with reference to FIG. 19.

FIG. 19 is a cross-sectional view of a light emitting display device according to an embodiment.

FIG. 19 additionally shows the stacked structure of the photosensor area OPS of the first element area DA2 as well as the stacked structure of the pixel of the display area DA.

First, the detailed stacked structure of the pixel formed in the first display area DA1 and the first element area DA2 is described with reference to FIG. 19.

The substrate 110 may include a material that does not bend due to a rigid characteristic such as glass, or a flexible material that may be bent, such as plastic or polyimide. FIG. 19 shows the flexible substrate and a structure in which polyimide and a barrier layer positioned thereon and formed of an inorganic insulating material are double formed.

A lower shielding layer BML is positioned on the substrate 110, and the lower shielding layer BML is disposed at the area overlapping a channel of a first semiconductor layer ACT1 (hereinafter referred to as a polycrystalline semiconductor layer). The lower shielding layer BML is also called a lower shielding layer, and may include a metal or a metal alloy such as copper (Cu), molybdenum (Mo), aluminum (Al), titanium (Ti), etc., and may be composed of a single layer or multiple layers. On the lower shielding layer BML, a buffer layer 111 covering it may be positioned, and the buffer layer 111 serves to block penetration of impurity elements into the first semiconductor layer, and may be an inorganic insulating layer including a silicon oxide (SiOx), a silicon nitride (SiNx), or a silicon oxynitride (SiONx).

A first semiconductor layer ACT1 is positioned on the buffer layer 111. The first semiconductor layer ACT1 may be formed of a polycrystalline semiconductor (P—Si) and includes a channel area, and a first area and a second area positioned on both sides of the channel area.

The first gate insulating layer 141 may be positioned to cover the first semiconductor layer ACT1 or to overlap only the channel area of the first semiconductor layer ACT1. The first gate insulating layer 141 may be an inorganic insulating layer including a silicon oxide (SiOx), a silicon nitride (SiNx), a silicon oxynitride (SiONx), or the like.

A first gate conductive layer GAT1 is positioned on the first gate insulating layer 141, and the first gate conductive layer GAT1 includes a gate electrode of a transistor (LTPS TFT) including a polycrystalline semiconductor. The first gate conductive layer GAT1 may include a metal such as copper (Cu), molybdenum (Mo), aluminum (Al), titanium (Ti), or a metal alloy thereof, and may be configured of a single layer or multiple layers. An area overlapping the gate electrode on a plane among the first semiconductor layer ACT1 may be a channel area. Also, in the present embodiment, the gate electrode positioned on the first gate conductive layer GAT1 serves as one electrode of the storage capacitor.

The first gate conductive layer GAT1 is covered by a second gate insulating layer 142, and the second gate insulating layer 142 may be an inorganic insulating layer including a silicon oxide (SiOx), a silicon nitride (SiNx), a silicon oxynitride (SiONx), or the like.

A second gate conductive layer GAT2 is positioned on the second gate insulating layer 142, and the second gate conductive layer GAT2 may include a first storage electrode overlapping the gate electrode to configure the storage capacitor Cst and a lower shielding layer BML for the oxide semiconductor transistor positioned under the oxide semiconductor layer ACT2. The second gate conductive layer GAT2 may include a metal or a metal alloy such as copper (Cu), molybdenum (Mo), aluminum (Al), or titanium (Ti), and may be configured as a single layer or multiple layers.

The second gate conductive layer GAT2 is covered by the first interlayer insulating layer 161, and the first interlayer insulating layer 161 may include an inorganic insulating layer including a silicon oxide (SiOx), a silicon nitride (SiNx), a silicon oxynitride (SiONx), etc.

An oxide semiconductor layer ACT2 is positioned on the first interlayer insulating layer 161, and the oxide semiconductor layer ACT2 may include a material such as IGZO, and includes a channel area, and a first area and a second area positioned on both sides of the channel area.

The oxide semiconductor layer ACT2 is covered by the third gate insulating layer 143, and the third gate insulating layer 143 may include an inorganic insulating layer including a silicon oxide (SiOx), a silicon nitride (SiNx), a silicon oxynitride (SiONx), etc.

The third gate insulating layer 143 and the first interlayer insulating layer 161 may have an opening overlapping a part of the lower shielding layer for the oxide semiconductor transistor (the oxide TFT) among the second gate conductive layer GAT2.

A third gate conductive layer GAT3 is positioned on the third gate insulating layer 143, and the third gate conductive layer GAT3 includes a gate electrode of the oxide semiconductor transistor (the oxide TFT) and a connecting part connected to the lower shielding layer for the oxide semiconductor transistor. The third gate conductive layer GAT3 may include a metal or a metal alloy such as copper (Cu), molybdenum (Mo), aluminum (Al), or titanium (Ti), and may be composed of a single layer or multiple layers.

The third gate conductive layer GAT3 is covered by a second interlayer insulating layer 162, and the second interlayer insulating layer 162 may include an inorganic insulating layer including a silicon oxide (SiOx), a silicon nitride (SiNx), a silicon oxynitride (SiONx), etc., and according to an embodiment, it may include an organic material.

The second interlayer insulating layer 162 and the insulating layer positioned thereunder may include an opening overlapping the first semiconductor layer ACT1 and the oxide semiconductor layer ACT2.

A first data conductive layer SD1 is positioned on the second interlayer insulating layer 162, and the first data conductive layer SD1 may play a role of providing the voltage or the current to the first semiconductor layer ACT1 and the oxide semiconductor layer ACT2 or transmitting the voltage or the current to another element by including the connecting part. The first data conductive layer SD1 may include a metal such as aluminum (Al), copper (Cu), molybdenum (Mo), titanium (Ti), or a metal alloy, and may be configured of a single layer or multiple layers.

A first organic layer 181 is covered by the first data conductive layer SD1. The first organic layer 181 may be an organic insulator including an organic material, and the organic material may include at least one material selected from the group consisting of polyimide, polyamide, acryl resin, benzocyclobutene, and phenol resin.

The first organic layer 181 may include an opening overlapping the first data conductive layer SD1, and the second data conductive layer SD2 is positioned on the first organic layer 181. The second data conductive layer SD2 may be connected to the first data conductive layer SD1 through the opening. The second data conductive layer SD2 may include a metal or a metal alloy such as aluminum (Al), copper (Cu), molybdenum (Mo), or titanium (Ti), and may be configured as a single layer or multiple layers.

The second data conductive layer SD2 is covered by a second organic layer 182 and a third organic layer 183. The second organic layer 182 and the third organic layer 183 may be organic insulators, and may include at least one material selected from the group consisting of polyimide, polyamide, acryl resin, benzocyclobutene, and phenol resin. According to an embodiment, the third organic layer 183 may be omitted. However, clue to the third organic layer 183, the anode (Anode) may have a more flat characteristic.

The anode (Anode) may be positioned on the third organic layer 183, and has a structure connected to the second data conductive layer SD2 through the opening positioned on the third organic layer 183. The anode (Anode) may be composed of a single layer including a transparent conductive oxide film and a metal material or a multilayer including these. The transparent conductive oxide film may include Indium Tin Oxide (ITO), poly-ITO, Iridium Zinc Oxide (IZO), Iridium Gallium Zinc Oxide (IGZO) and Iridium Tin Zinc Oxide (ITZO), and the metal material may include silver (Ag), molybdenum (Mo), copper (Cu), gold (Au), and aluminum (Al).

On the anode (Anode), a black pixel defining layer 380 having an opening OP that overlaps with at least part of the anode (Anode) and covering other parts of the anode (Anode) is positioned. The black pixel defining layer 380 may further include a light blocking material in addition to the organic insulating material. The light blocking material includes carbon black, carbon nanotubes, a resin or paste containing a black dye, metal particles, such as nickel, aluminum, molybdenum, and alloys thereof, metal oxide particles (e.g., chromium nitride), etc. The black pixel defining layer 380 may be formed of an organic material having a negative type of black color. Because the negative type of organic material is used, it may have a characteristic that the part covered by the mask is removed.

An opening OP is formed in the black pixel defining layer 380, and the emission layer EL is positioned in the opening OP. The emission layer EL may be formed of an organic light emitting material, and the adjacent emission layers EL may display different colors. On the other hand, according to an embodiment, each of the emission layers EL may display light of the same color due to the color filter 230 positioned thereon.

A spacer 385 is formed on the black pixel defining layer 380. The spacer 385 may be formed as a structure having a step difference, and the spacer 385 includes a first portion 385-1 having a high height and positioned in a narrow area and a second portion 385-2 having a low height and positioned in a wide area. The spacer 385 may be formed of photosensitive polyimide (PSPI).

A functional layer FL is positioned on the emission layer EL, the spacer 385, and the exposed black pixel defining layer 380, and the functional layer FL may be formed on the entire surface of the light emitting display device DP. The functional layer FL may include an electron injection layer, an electron transport layer, a hole transport layer, and a hole injection layer, and the functional layer FL may be positioned above and below the emission layer EML. That is, the hole injection layer, the hole transport layer, the emission layer EML, the electron transport layer, the electron injection layer, and the cathode (Cathode) are sequentially positioned on the anode (Anode), so that the hole injection layer and the hole transport layer among the functional layer FL may be positioned under the emission layers EML, and the electron transport layer and the electron injection layer may be placed on the emission layer EML. According to an embodiment, the functional layer FL may also be positioned in the light transmitting area.

The cathode (Cathode) may be formed of a light-transmitting electrode or a reflecting electrode. According to an embodiment, the cathode may be a transparent or semi-transparent electrode, and may be formed of a metal thin film having a small work function, including lithium (Li), calcium (Ca), lithium fluoride/calcium (LiF/Ca), lithium fluoride/aluminum (LiF/Al), aluminum (Al), silver (Ag), magnesium (Mg), and a compound thereof. In addition, a transparent conductive oxide (TCO) such as Iridium Tin Oxide (ITO), Indium Zinc Oxide (IZO), zinc oxide (ZnO), or indium oxide (In2O3) may be further disposed on the metal thin film. The cathode may be integrally formed over the entire surface in the light emitting display panel DP except for the light transmitting area.

An encapsulation layer 400 is positioned on the cathode (Cathode). The encapsulation layer 400 may include at least one inorganic layer and at least one organic layer, and may have a triple layer structure including a first inorganic encapsulation layer, an organic encapsulation layer, and a second inorganic encapsulation layer. The encapsulation layer 400 may be to protect the emission layer EML formed of an organic material from moisture or oxygen that may be inflowed from the outside. According to an embodiment, the encapsulation layer 400 may include a structure in which an inorganic layer and an organic layer are sequentially further stacked.

Detecting insulating layers 501, 510, and 511 and a plurality of detecting electrodes 540 and 541 are positioned on the encapsulation layer 400 for touch sensing. Here, the detecting electrodes 540 and 541 may include a metal or a metal alloy such as aluminum (Al), copper (Cu), silver (Ag), gold (Au), molybdenum (Mo), titanium (Ti), or tantalum (Ta), and may be composed of a single layer or multiple layers. In the present embodiment, a lower detecting insulating layer 501 is positioned under the lower detecting electrode 541, a middle detecting insulating layer 510 is positioned between the lower detecting electrode 541 and the upper detecting electrode 540, and an upper detecting insulating layer 511 is positioned between the upper detecting electrode 540 and the light blocking layer 220. The upper detecting insulating layer 511 may also be positioned under the color filters 230R, 230G, and 230B.

The light blocking layer 220 and the color filter 230 are positioned on the upper detecting electrodes 540 and 541. FIG. 17 briefly shows the structure of the light blocking layer 220 and the color filter 230, but they may have one of the structures described in FIG. 5 to FIG. 15 and FIG. 17.

That is, the light blocking layer 220 has an opening OPBM corresponding to the opening OP of the black pixel defining layer 380, and each color filter 230 is filled in the opening OPBM. Among them, one color filter has an overlapping part overlapping more with the light blocking layer, and may further include an opening (referring to OPCrg, OPCrb of FIG. 6) corresponding to the opening OPBM of the light blocking layer 220 corresponding to the color filter of another color. As a result, the color filters of one color are all positioned on the light blocking layer 220. Here, one of the color filters 230 may be stacked over the entire area and an opening may be formed using a mask, and the remaining color filters may be formed in the opening of the color filter or the light blocking layer 220 by an inkjet method. According to an embodiment, the color filter 230 may be replaced with a color conversion layer or may further include a color conversion layer. The color conversion layer may include quantum dots.

A planarization layer 550 covering the color filter 230 is positioned on the color filter 230. The planarization layer 550 is for planarizing the upper surface of the light emitting display device, and may be a transparent organic insulator including at least one material selected from the group consisting of polyimide, polyamide, acryl resin, benzocyclobutene, and phenol resin.

According to an embodiment, a low refractive layer and an additional planarization layer may be further positioned on the planarization layer 550 to improve front visibility and light output efficiency of the display device. Light may be emitted while being refracted to the front by the low refractive layer and the additional planarization layer having a high refractive characteristic. In this case, the low refractive layer and the additional planarization layer may be positioned directly on the color filter 230 while the planarization layer 550 is omitted according to an embodiment.

In the present embodiment, a polarizer on the planarization layer 550 is not included. That is, the polarizer may serve to prevent display deterioration that the user recognizes as the external light is incident and reflected from the anode and the like. However, in the present embodiment, the black pixel defining layer 380 covers the side of the anode (Anode) to reduce the degree of the reflection from the anode (Anode), and the light blocking layer 220 is also formed to reduce the incidence of light, thereby the structure for preventing the deterioration of the display quality due to the reflection is already included. Therefore, there is no need to separately form the polarizer on the front of the light emitting display device DP.

Hereinafter, the stacked structure of the photosensor area OPS is described with reference to FIG. 19.

The photosensor area OPS consists of only a transparent layer to allow light to pass through, and there is no conductive layer or semiconductor layer positioned, and an opening (hereinafter also referred to as an additional opening) may be formed at the position corresponding to the photosensor area OPS in the black pixel defining layer 380, the light blocking layer 220, and the color filter 230 to have a structure that does not block light.

Specifically, based on FIG. 19, the stacked structure of the photosensor area OPS according to an embodiment is as follows.

A buffer layer 111 of an inorganic insulating layer is positioned on the substrate 110, and a first gate insulating layer 141 and a second gate insulating layer 142 of an inorganic insulating layer are sequentially positioned thereon. Also, on the second gate insulating layer 142, a first interlayer insulating layer 161, a third gate insulating layer 143, and a second interlayer insulating layer 162 of an inorganic insulating layer are sequentially stacked.

On the second interlayer insulating layer 162, a first organic layer 181, a second organic layer 182, and a third organic layer 183 of an organic insulator are sequentially stacked.

A functional layer FL may be positioned on the third organic layer 183, and a cathode (Cathode) may be positioned thereon.

An encapsulation layer 400 is positioned on the cathode (Cathode), and the detecting insulating layers 501, 510, and 511 are sequentially positioned thereon. The encapsulation layer 400, as shown in FIG. 5, may have a triple layer structure including a first inorganic encapsulation layer 401, an organic encapsulation layer 402, and a second inorganic encapsulation layer 403. In addition, the detecting insulating layers 501, 510, and 511 may all be inorganic insulating layers.

Here, referring to FIG. 17, a light blocking layer 220 and additional openings OPBM-1 and OPC-1 of the red color filter 230R are respectively disposed on the encapsulation layer 400 and under the detecting insulating layers 501, 510, and 511. In addition, an additional opening OP-1 of the black pixel defining layer 380 is positioned between the third organic layer 183 and the functional layer FL.

A planarization layer 550 may be positioned on the detecting insulating layers 501, 510, and 511.

In the above photosensor area OPS, the metal layer BML, the first semiconductor layer ACT1, the first gate conductive layer GAT1, the second gate conductive layer GAT2, the oxide semiconductor layer ACT2, the third gate conductive layer GAT3, the first data conductive layer SD1, the second data conductive layer SD2, and the anode (Anode) are not positioned. Also, the emission layer EML, and the detecting electrodes 540 and 541 are not formed.

Additionally, in the photosensor area OPS, an additional opening (referring to FIG. 17) is formed in the black pixel defining layer 380, the light blocking layer 220, and the color filter 230, and the black pixel defining layer 380, the light blocking layer 220, and the color filter 230 are not formed therein.

In the above, the embodiment in which a total of three organic layers are formed, and the opening for an anode connection is formed in the second organic layer and the third organic layer, is described. However, the organic layer may be formed of at least two, and in this case, the opening for the anode connection may be positioned in the upper organic layer positioned away from the substrate, and a lower organic layer opening may be positioned in the lower organic layer.

In some embodiments, the light emitting display device may not include the first element area DA2 including the light transmitting area, and the photosensor area OPS may not be formed. In the light emitting display device of such an embodiment, the single layer structure of the pixels corresponding to the display area DA of FIG. 19 may be maintained as it is.

A reflection adjusting layer may be disposed on the light blocking layer 220. The reflection adjusting layer may selectively absorb light of a wavelength of a partial band among light reflected inside the display device or light incident outside the display device. The reflection adjusting layer may fill the opening OP.

For example, the reflection adjusting layer absorbs a first wavelength region of 490 nm to 505 nm and a second wavelength region of 585 nm to 600 nm, and thus light transmittance in the first wavelength region and second wavelength region may be 40% or less. The reflection adjusting layer may absorb light of a wavelength outside the emission wavelength range of red, green, or blue emitted from the light emitting diode ED. As described, the reflection adjusting layer absorbs light of a wavelength that does not belong to a wavelength range of red, green, or blue emitted from the light emitting diode, thereby preventing or minimizing the reduction in luminance of the display device and simultaneously preventing or minimizing the deterioration of the luminous efficiency and improving visibility of the display device.

In the embodiment, the reflection adjusting layer may be provided as an organic material layer including a dye, a pigment, or combination thereof. The reflection adjusting layer may contain a tetraazaporphyrin (TAP)-based compound, a porphyrin-based compound, a metal porphyrin-based compound, an oxazine-based compound, and a squarylium-based compound, a triarylmethane compound, a polymethine compound, an anthraquinone compound, a phthalocyanine compound, an azo compound, a perylene compound, a xanthene-based compound, a diammonium-based compound, a dipyrromethene-based compound, a cyanine-based compound, and a combination thereof.

In the embodiment, the reflection adjusting layer may have transmittance of about 64% to 72%. The transmittance of the reflection adjusting layer may be adjusted according to the content of the pigment and/or dye included in the reflection adjusting layer.

According to embodiments, the reflection adjusting layer may not be disposed in the first element area DA2. In addition, an embodiment including the reflection adjusting layer may further include a capping layer and a low reflection layer disposed between the cathode (Cathode) and the encapsulation layer 400.

The capping layer may serve to improve the luminous efficiency of the light emitting diode ED by the principle of constructive interference. The capping layer may include, for example, a material having a refractive index of 1.6 or more for light having a wavelength of 589 nm.

The capping layer may be an organic capping layer including an organic material, an inorganic capping layer including an inorganic material, or a composite capping layer including an organic material and an inorganic material. For example, the capping layer may contain a carbocyclic compound, a heterocyclic compound, an amine group-containing compound, a porphine derivative, a phthalocyanine derivative, a naphthalocyanine derivative, an alkali metal complex, alkaline earth metal complexes, or any combination thereof. The carbocyclic compounds, the heterocyclic compounds, and the amine group-containing compounds may be optionally substituted with substituents including O, N, S, Se, Si, F, Cl, Br, I, or any combination thereof.

A low reflection layer may be disposed on the capping layer. The low reflective layer may overlap a front surface of the substrate 110.

The low reflective layer may include an inorganic material having low reflectance, and in an embodiment, it may include a metal or metal oxide. When the low reflective layer contains a metal, it may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), and it may include zinc (Zn), germanium (Ge), silver (Ag), magnesium (Mg), gold (Au), copper (Cu), calcium (Ca), or a combination thereof. In addition, when the low reflective layer contains a metal oxide, it may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, or a combination thereof.

In the embodiment, an absorption coefficient (k) of the inorganic material included in the low reflective layer may be 4.0 or less and 0.5 or more (0.5 k 4.0). In addition, the inorganic material included in the low reflective layer may have a refractive index (n) of 1 or more (n≥1.0).

The low reflective layer induces destructive interference between the light incident into the display device and the light reflected from the metal disposed under the low reflective layer, thereby reducing reflection of external light. Accordingly, the display quality and visibility of the display device can be improved by reducing the reflection of the external light of the display device through the low reflective layer.

According to embodiments, the capping layer may not be formed, and then the low reflective layer may be contact the cathode (Cathode) directly.

The encapsulation layer is disposed on the low reflective layer, other structures may be the same as FIGS. 5 and 19.

While this disclosure has been described in connection with what is presently considered to be practical embodiments, it is to be understood that the inventive concept is not limited to the disclosed embodiments. On the contrary, it is intended to cover various modifications and equivalent arrangements included within the spirit and scope of the appended claims.

What is claimed is:

1. A light emitting display device comprising:
   a substrate;
   a pixel circuit unit positioned on the substrate;
   a light emitting diode (LED) electrically connected to the pixel circuit unit;
   an encapsulation layer covering the pixel circuit unit and the light emitting diode (LED);
   a light blocking layer disposed on the encapsulation layer and having a first opening, a second opening, and a third opening;
   a first color filter including a main part in the first opening, and a first overlapping part separated from the main part of the first color filter and covering the light blocking layer;
   a second color filter in the second opening; and
   a third color filter in the third opening,
   wherein the first overlapping part of the first color filter, which is disposed between the second color filter and the third color filter and is not disposed in the first opening, has a first side contacting the second color filter and a second side contacting the third color filter, and all portions of the first overlapping part of the first color filter overlap the light blocking layer in a plan view.

2. The light emitting display device of claim 1, wherein the first color filter further includes a second overlapping part which is connected to the main part of the first color filter and covers the light blocking layer.

3. The light emitting display device of claim 1, wherein the first color filter has a color filter opening aligned with the second opening and the third opening.

4. The light emitting display device of claim 3, wherein the color filter opening of the first color filter aligns with the second opening and the third opening of the light blocking layer, and the second opening and the third opening are smaller than the color filter opening of the first color filter in plan view.

5. The light emitting display device of claim 4, wherein the light emitting diode (LED) includes an anode, an emission layer, and a cathode, and a black pixel defining layer including a light blocking material, covering an edge of the anode and having an opening aligned with the anode.

6. The light emitting display device of claim 5, wherein the opening of the black pixel defining layer is aligned with the first opening, the second opening, and the third opening of the light blocking layer, and the opening of the black pixel defining layer is smaller than the first opening, the second opening, and the third opening in plan view.

7. The light emitting display device of claim 6, wherein the second color filter, the third color filter, the first opening, the second opening, and the third opening of the light blocking layer, the color filter opening of the first color filter, and the opening of the black pixel defining layer have the same shape in plan view, or a chamfered version of the same shape.

8. The light emitting display device of claim 7, further comprising a detecting electrode aligned with the light blocking layer and the first overlapping part.

9. The light emitting display device of claim 7, further comprising:

a photosensor area through which light can pass, and an additional opening formed in the first color filter, the light blocking layer, and the black pixel defining layer in the photosensor area.

10. The light emitting display device of claim 9, wherein the additional opening of the first color filter positioned in the photosensor area is integrally formed with the adjacent color filter opening.

11. The light emitting display device of claim 10, wherein three color filter openings positioned adjacent to the photosensor area and two additional openings of the first color filter are integrally formed.

12. The light emitting display device of claim 10, wherein the additional opening of the light blocking layer is aligned with and smaller than the additional opening of the first color filter in plan view, and the additional opening of the black pixel defining layer is aligned with and smaller than the additional opening of the light blocking layer in plan view.

13. The light emitting display device of claim 9, further comprising a detecting electrode aligned with the light blocking layer and the first overlapping part.

14. The light emitting display device of claim 9, further comprising a component area positioned at the periphery of the photosensor area and having a light transmitting area.

15. The light emitting display device of claim 14, wherein there is a plurality of photosensor areas.

16. The light emitting display device of claim 5, further comprising a spacer positioned on the black pixel defining layer and having a step.

17. The light emitting display device of claim 1, wherein the second color filter and the third color filter are formed by an inkjet method.

18. An electronic apparatus comprising:

a light emitting display device including a substrate, a pixel circuit unit positioned on the substrate, a light emitting diode (LED) electrically connected to the pixel circuit unit, and an encapsulation layer covering the pixel circuit unit and the light emitting diode (LED); and a control module controlling an operation of the light emitting display device, wherein the light emitting display device further includes:

a light blocking layer disposed on the encapsulation layer and having a first opening, a second opening, and a third opening;

a first color filter including a main part in the first opening, and an overlapping part separated from the main part of the first color filter and covering the light blocking layer;

a second color filter in the second opening; and a third color filter in the third opening, and wherein the overlapping part of the first color filter, which is disposed between the second color filter and the third color filter and is not disposed in the first opening, has a first side contacting the second color filter and a second side contacting the third color filter, and all portions of the first overlapping part of the first color filter overlap the light blocking layer in a plan view.

* * * * *